United States Patent
Tanaka et al.

(10) Patent No.: US 7,532,378 B2
(45) Date of Patent: May 12, 2009

(54) LASER IRRADIATION APPARATUS, METHOD OF LASER IRRADIATION, AND METHOD FOR MANUFACTURING SEMICONDUCTOR DEVICE

(75) Inventors: Koichiro Tanaka, Isehara (JP); Hirotada Oishi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 158 days.

(21) Appl. No.: 11/705,794

(22) Filed: Feb. 14, 2007

(65) Prior Publication Data

US 2007/0195834 A1    Aug. 23, 2007

(30) Foreign Application Priority Data

Feb. 21, 2006    (JP)    ............... 2006-044201

(51) Int. Cl.
    *G02B 26/08*    (2006.01)
    *H01L 21/00*    (2006.01)
(52) U.S. Cl. ........................ 359/224; 438/795
(58) Field of Classification Search ................ 359/223, 359/224, 290, 298; 438/99, 487, 795; 355/53, 355/67
    See application file for complete search history.

(56) References Cited

U.S. PATENT DOCUMENTS

| | | | |
|---|---|---|---|
| 5,684,617 A | 11/1997 | Langhans | |
| 6,462,307 B1 | 10/2002 | Hennig et al. | |
| 6,870,554 B2 * | 3/2005 | Jain | ............... 345/697 |
| 6,897,405 B2 | 5/2005 | Cheng et al. | |
| 6,897,889 B2 | 5/2005 | Tanaka | |
| 7,094,452 B2 | 8/2006 | Yamashita et al. | |
| 2002/0164069 A1 | 11/2002 | Nagano et al. | |
| 2004/0065643 A1 | 4/2004 | Tanaka | |
| 2004/0074881 A1 | 4/2004 | Oishi | |
| 2004/0182831 A1 | 9/2004 | Cheng et al. | |
| 2004/0183855 A1 | 9/2004 | Cheng et al. | |
| 2004/0209410 A1 | 10/2004 | Tanaka | |
| 2005/0036190 A1 | 2/2005 | Tanaka | |

(Continued)

FOREIGN PATENT DOCUMENTS

JP    08-276288    10/1996

(Continued)

OTHER PUBLICATIONS

International Search Report (Application No. PCT/JP2007/051322) Dated May 1, 2007.

(Continued)

*Primary Examiner*—William C Choi
(74) *Attorney, Agent, or Firm*—Eric J. Robinson; Robinson Intellectual Property Law Office, P.C.

(57) ABSTRACT

A laser irradiation apparatus and a method of laser irradiation which can improve use efficiency of a laser beam, eliminate an influence of stray light at a DMD, and form an irradiation pattern with a homogeneous beam spot are provided. The laser irradiation apparatus includes at least a laser oscillator, a diffractive optical element, and an optical element having many minute mirrors arranged two-dimensionally. A laser beam emitted from the laser oscillator is divided into plural laser beams by a diffractive optical element and the laser beams are deflected by plural micromirrors. The divided laser beams have equal energy to each other.

10 Claims, 23 Drawing Sheets

U.S. PATENT DOCUMENTS

| | | | |
|---|---|---|---|
| 2005/0037552 | A1 | 2/2005 | Yamazaki et al. |
| 2005/0133790 | A1 | 6/2005 | Kato |
| 2005/0139582 | A1 | 6/2005 | Tanaka |
| 2005/0146006 | A1 | 7/2005 | Yamazaki et al. |
| 2006/0039651 | A1 | 2/2006 | Sandstrom |
| 2006/0087635 | A1 | 4/2006 | Kazumi et al. |
| 2007/0184639 | A1 | 8/2007 | Tanaka et al. |
| 2007/0184670 | A1 | 8/2007 | Koyama |
| 2007/0197049 | A1 | 8/2007 | Tanaka et al. |

FOREIGN PATENT DOCUMENTS

| | | |
|---|---|---|
| JP | 2001-105166 | 4/2001 |
| JP | 2002-228818 | 8/2002 |
| JP | 2002-292487 | 10/2002 |
| JP | 2004-306127 | 11/2004 |
| JP | 2005-116682 | 4/2005 |
| JP | 2005-511312 | 4/2005 |
| JP | 2005-203763 | 7/2005 |
| JP | 2005-268774 | 9/2005 |
| JP | 2005-275325 | 10/2005 |
| WO | WO 03/047805 | 6/2003 |
| WO | WO 2005/081307 | 9/2005 |

OTHER PUBLICATIONS

Written Opinion (Application No. PCT/JP2007/051322) Dated May 1, 2007.

* cited by examiner

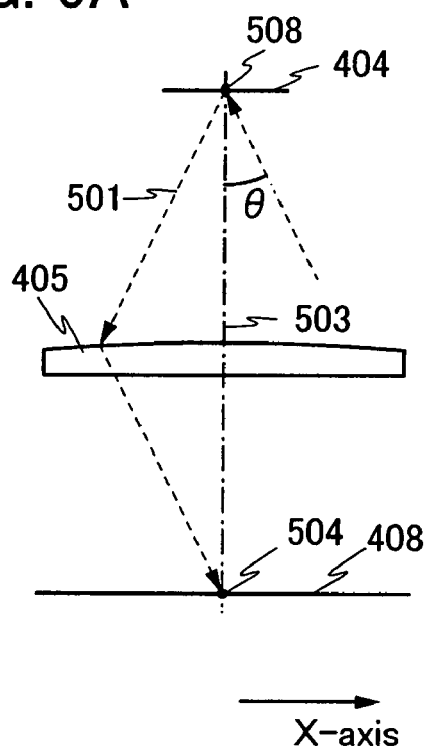
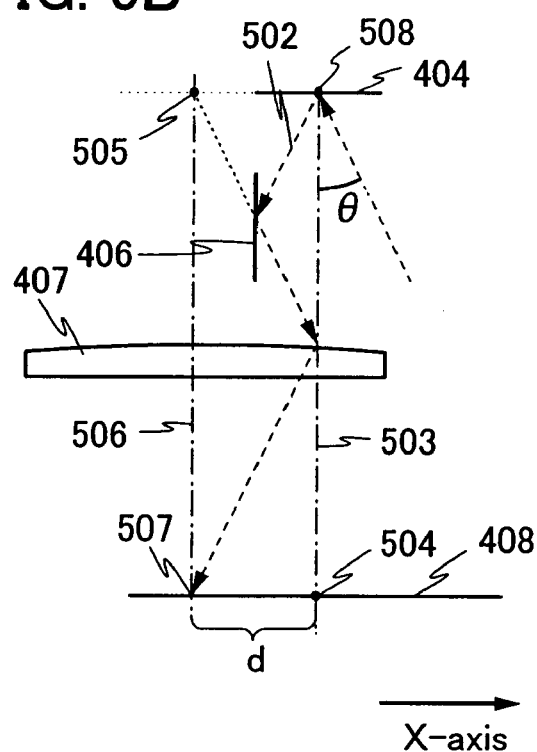
FIG. 5A
FIG. 5B

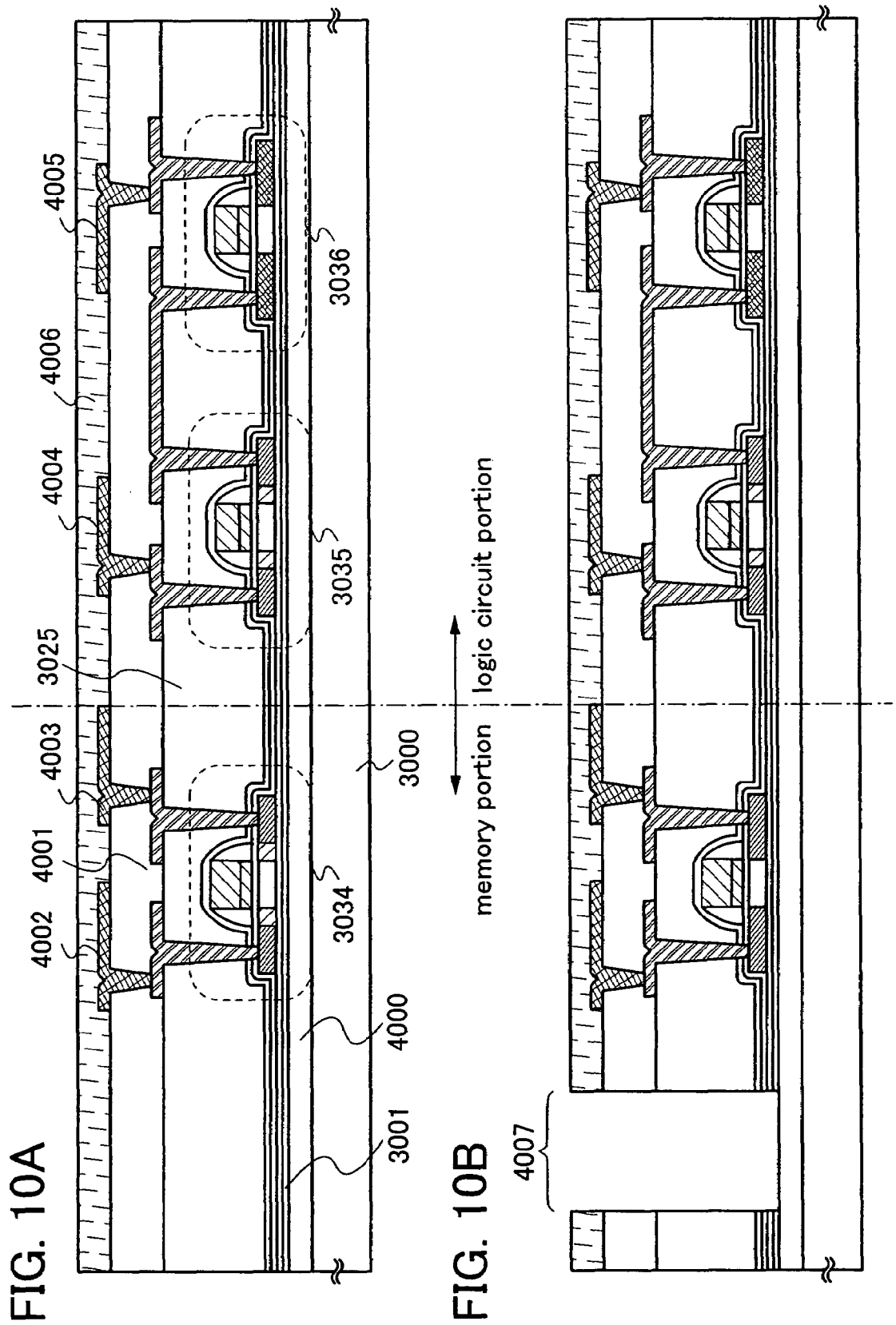

LASER IRRADIATION APPARATUS, METHOD OF LASER IRRADIATION, AND METHOD FOR MANUFACTURING SEMICONDUCTOR DEVICE

BACKGROUND OF THE INVENTION

1. Field of the Invention

The present invention relates to a laser irradiation apparatus and a method of laser irradiation in order to efficiently perform laser irradiation in a laser direct imaging method or the like. In addition, the present invention relates to a method for manufacturing a semiconductor device with the use of a process of the laser irradiation.

2. Description of the Related Art

In manufacturing processes of a semiconductor device, a printed board, and the like, with an integration of a circuit, microfabrication is essential. In general, such microfabrication is performed by a laser light-exposure technology in which a photo mask with a circuit pattern written therein is made preliminarily and the pattern is transferred to a substrate. However, the method which uses the photo mask spends cost and time for making the mask. Therefore, in recent years, a process without the photo mask (herein after referred to as maskless process) has drawn attention. As a typical maskless process, there is a laser direct imaging method. In the laser direct imaging method, a photosensitive material is discharged or applied on a conductive film formed by sputtering or the like. And upon the photosensitive material, a laser direct imaging apparatus is used to perform irradiation with a laser beam. At that time, the irradiation with the laser beam is performed selectively and development is further performed, so that the mask is formed in the area irradiated with the laser beam. Subsequently, the conductive film can be formed in a desired pattern by etching the conductive film using this mask. Accordingly, the circuit pattern of a TFT (a thin film transistor) or an IC can be made.

A method to divide a laser beam into a plurality of beam spots using a digital micromirror device (DMD) is known to form a desired irradiation pattern by a laser direct imaging method. The DMD is a device in which a plurality of minute micromirrors are aligned two-dimensionally, and because each of a plurality of micromirrors operates individually, desired irradiation patterns can be created on an irradiated surface. In addition, since the response time of the plurality of micromirrors constituting the DMD is extremely short such as several μs, plural patterns can be changed at high speed. A laser light-exposure apparatus using a DMD is suggested in view of such advantages (for example, patent document 1).

A DMD is a reflection type optical modulation element in which a plurality of minute micromirrors are aligned two-dimensionally. The DMD includes a micromirror, a hinge to fix the micromirror, a yoke, a CMOS memory semiconductor, and the like, and controls the tilt of each micromirror by generating an electrostatic force under the micromirror. The micromirror can be manufactured with a size of about several tens of μm, and each micromirror's angle becomes about ±10% variable responding to signals "1" and "0" which are added to an address electrode.

When the laser irradiation is performed using the DMD, the beam spot which is formed by each micromirror is required to have an equal beam characteristic to each other. In particular, in a light-exposure process of a semiconductor film and the like, microfabrication in a size of several μm is required. Therefore, in order to perform such microfabrication precisely, the spot size, energy, and the like of the beam spot are required to be homogenized at high level. Thus, when the laser beam is incident on the DMD and forms the irradiation pattern, an energy distribution of the laser beam is homogenized beforehand. As the methods for homogenizing the laser beam, there are methods using a diffusion plate, a kaleidoscope, an array lens, and the like. [Patent Document 1] Japanese Patent Laid-Open No. 2005-275325 bulletin

SUMMARY OF THE INVENTION

However, even when the laser beam homogenized by the above-mentioned method is used, there were cases in which each laser beam reflected by the DMD had a different characteristic. Since each of the plural micromirrors structuring the DMD operates independently, there is a region between the mirrors. The region between the mirrors is a marginal area which is for each mirror to operate independently, and such a region cannot be eliminated. There was a problem that the laser beam reflected back in this region and an outer edge of the mirror becomes stray light and a beam spot is formed in a place other than the desired beam pattern. In addition, the micromirror is not a complete plane and a distortion may be generated in its shape in the course of manufacturing. This distortion is especially large in the outer edge, and the laser beam reflected in this part becomes the stray light in some cases. Thus, a method in which a slit is provided in front or back of a microlens for converging a laser beam to block stray light is suggested. However, in the case of this method, the stray light might go through an opening of the slit; therefore even if plural pieces of the slits are used, it is impossible to completely remove the influence of the stray light.

In addition, in a conventional light-exposure apparatus using the DMD, a micro lens array for converging the laser beam reflected by the micromirror that constitutes the DMD is essential. In the micro lens array, plural lenses each corresponding to a laser beam are arrayed. However, when using the micro lens array, for example, since for the laser beam of an ultraviolet light region, quartz or the like must be used as the basic material of the micro lens array, the apparatus has a very expensive structure. In addition, as a method which does not use the micro lens array, a method in which the laser beam reflected by the micromirror goes through a pinhole to be formed, and an image of a pinhole opening is projected to the irradiated surface by a reduction optical system, and the like are considered. However, in the case of this method, since most of the laser beam is blocked by the pinhole, it has a problem in a point of energy use efficiency. In addition, a problem that the pinhole changes its shape by heat so that the shape of the beam spot and the irradiated position are displaced is difficult to be completely evaded.

It is an object of the present invention to provide a laser irradiation apparatus and a method of laser irradiation which can solve the problems and improve the use efficiency of the laser beam, and at the same time remove the influence of the stray light at the DMD and form an irradiation pattern with a homogeneous beam spot.

The laser irradiation apparatus of the present invention includes at least a laser oscillator, a diffractive optical element, and an optical element (it is called a digital micromirror device (DMD) and so forth. Hereinafter, it is referred to as DMD) in which plural minute mirrors (hereinafter referred to as micromirrors) are arranged two-dimensionally. Note that the laser beam emitted from the laser oscillator is divided into plural laser beams by the diffractive optical element, and the laser beams are deflected at the micromirrors. Here, each of the plural micromirrors can be individually adjusted. By setting the angle of the micromirror individually, the laser beam which is deflected at each micromirror is delivered to a desired position on a substrate.

A laser irradiation apparatus of the present invention includes a laser oscillator which emits a laser beam, a diffractive optical element which divides the laser beam into a plurality of laser beams, a plurality of micromirrors each of which deflects each of the plurality of laser beams divided by the diffractive optical element, and a transfer stage to be provided with an irradiated body (hereinafter also referred to as object) to which each of the plurality of laser beams deflected by each the plurality of micromirrors are delivered. Each of the plurality of laser beams is converged in a central portion of each of the plurality of micromirrors or each of the plurality of laser beams is converged between a central portion and a corner portion of each of the plurality of micromirrors. It is preferable that a spot size of each of the plurality of laser beams on each of the plurality of micromirrors is smaller than a size of surface area of each of the plurality of micromirrors.

In the laser irradiation apparatus of the present invention, the diffractive optical element is a transmission type diffractive optical element or a reflection type diffractive optical element.

In the laser irradiation apparatus of the present invention, each of the plurality of laser beams has equal energy to each another.

The laser irradiation apparatus of the present invention includes a projection lens placed between the diffractive optical element and the transfer stage.

A method of laser irradiation of the present invention includes: dividing a laser beam emitted from a laser oscillator into a plurality of laser beams by a diffractive optical element; and deflecting the plurality of laser beams, by a plurality of micromirrors and irradiating an object on a transfer stage with each of the plurality of laser beams. Each of the plurality of laser beams is converged in a central portion of each of the plurality of micromirrors or each of the plurality of laser beams is converged between a central portion and a corner portion of each of the plurality of micromirrors. It is preferable that a spot size of each of the plurality of laser beams on each of the plurality of micromirrors is smaller than a size of surface area of each of the plurality of micromirrors.

A method of laser irradiation of the present invention includes: dividing a laser beam emitted from a laser oscillator by a diffractive optical element into at least a first laser beam and a second laser beam; delivering the first laser beam to a first micromirror and delivering the second laser beam to a second micromirror; and irradiating an object with the first laser beam and the second laser beam deflected by the first micromirror and the second micromirror. The first laser beams is converged in a central portion of the first micromirror and the second laser beam is converged in a central portion of the second micromirror or the first laser beam is converged between a central portion and a corner portion of the first micromirror and the second laser beam is converged in a central portion of the second micromirror. It is preferable that a spot size of the first laser beam on the first micromirror is smaller than a size of surface area of the first micromirror and a spot size of the second laser beam on the second micromirror is smaller than a size of surface area of the second micromirror.

In the method of laser irradiation of the present invention, the diffractive optical element is a transmission type diffractive optical element or a reflection type diffractive optical element.

In the method of laser irradiation of the present invention, each of the plurality of laser beams has equal energy to each another.

In the method of laser irradiation of the present invention, after the plurality of laser beams pass by a projection lens, the object is irradiated with the plurality of laser beams.

A manufacturing method of a semiconductor device of the present invention includes: forming a plurality of island shape semiconductor layers each having a source electrode or a drain electrode over a substrate; forming a first interlayer insulating film over the plurality of island shape semiconductor layers; forming a plurality of gate electrodes over each of the plurality of island shape semiconductors with the first interlayer insulating film interposed therebetween; forming a second interlayer insulating film over the plurality of gate electrodes, providing a resist over the second interlayer insulating film; dividing a laser beam into a plurality of laser beams by a diffractive optical element, deflecting each of the plurality of laser beams by each of a plurality of micromirrors, and then irradiating the resist with each of the plurality of laser beams; developing the resist irradiated with each of the plurality of laser beams; and etching the first interlayer insulating film and the second interlayer insulating film to form a contact hole selectively. Each of the plurality of laser beams is converged in a central portion of each of the plurality of micromirrors or each of the plurality of laser beams is converged between a central portion and a corner portion of each of the plurality of micromirrors. It is preferable that a spot size of each of the plurality of laser beams on each of the plurality of micromirrors is smaller than a size of surface area of each of the plurality of micromirrors.

By the present invention, since the beam spot of the laser beam can be a smaller spot size than a size of a surface area of the micromirror, the influence of the stray light generated due to the region between the micromirrors which constitute the DMD or the outer edge of the micromirror can be removed. In addition, the use efficiency of the laser beam can be improved. Moreover, an invasion of the laser beam to the region between the micromirrors can be prevented; therefore a damage and a malfunction of the device can be prevented. In addition, when using a diffractive optical element with the function of homogenizing the energy of the laser beam, since it is not necessary to newly provide a beam homogenizer in the optical system, the number of elements in the optical system can be reduced. In addition, since the beam spot can be converged by the diffractive optical element, the micro lens array is not needed to be used for converging the laser beam and the number of elements in the optical system can be reduced. With the above structure, the number of elements in the optical system can be reduced, and the laser irradiation apparatus can be constructed with low cost. In addition, since the number of elements in the optical system can be reduced, downsizing of the laser irradiation apparatus is possible.

In addition, by the present invention, a deflection direction of the laser beam can be changed in a short time; therefore, the laser irradiation can be performed while changing various irradiation patterns. In addition, plural beam spots can be formed at a time. Therefore, even when forming a complex irradiation pattern, the laser irradiation can be efficiently performed. If the present apparatus is applied to a laser direct

BRIEF DESCRIPTION OF DRAWINGS

FIGS. 5A and 5B are diagrams showing structures of a laser irradiation apparatus.

FIGS. 10A and 10B are diagrams showing a manufacturing process of a semiconductor device.

DETAILED DESCRIPTION OF THE INVENTION

Figure 1:
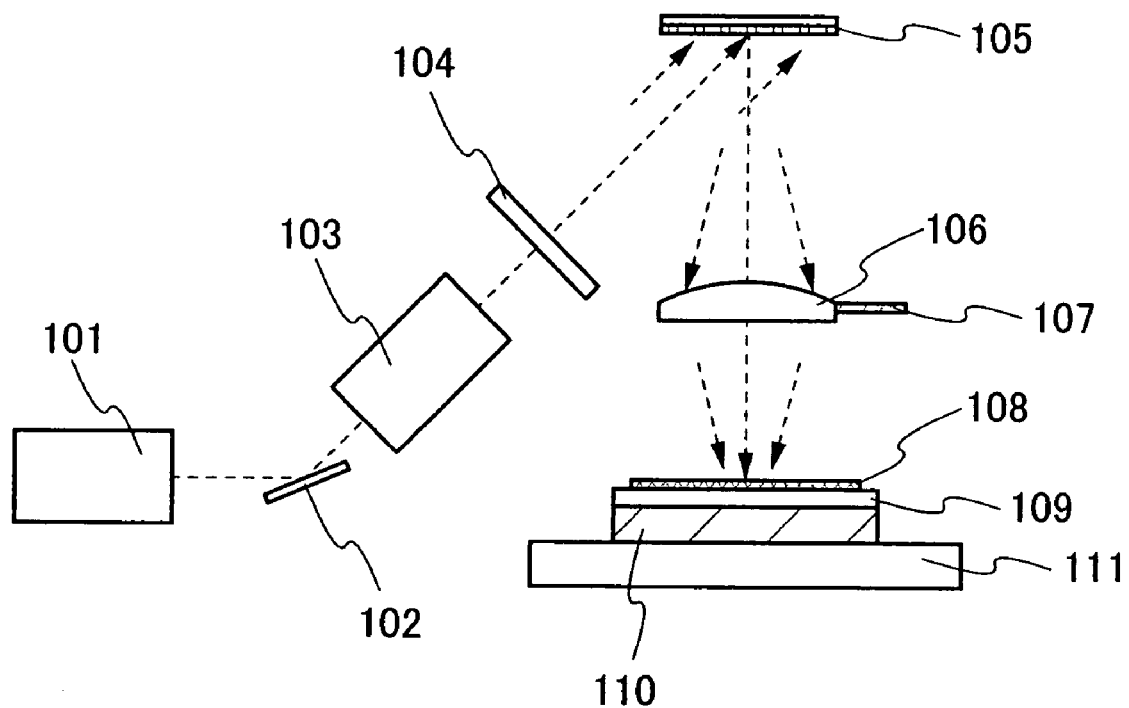
FIG. 1 is a diagram showing a structure of a laser irradiation apparatus.

Hereinafter, detailed description of the preferred embodiment modes and embodiments is explained with the reference to the drawings. However, the present invention is not limited to the description below, and it is easily understood by those skilled in the art that modes and details herein disclosed can be modified in various ways without departing from the spirit and the scope of the present invention. Therefore, the present invention should not be interpreted as being limited to the description of the embodiment modes and embodiments to be given below. Note that in the structure of the present invention described hereinafter, reference numerals denoting the same portions are used in common in the drawings, and repeated description thereof may be omitted.

Embodiment Mode 1

This embodiment mode will show an example in which a laser beam is divided into plural number by a transmission type diffractive optical element, and the laser beams are incident on a DMD and are selectively delivered to a substrate surface.

FIG. 1 shows a schematic block diagram of a laser irradiation apparatus of this embodiment mode. Note that in FIG. 1, the directions shown by dotted-line arrows are the traveling directions of a laser beam. Here, the laser beam emitted from a laser oscillator 101 is deflected by a mirror 102, and is incident on an expander 103. The expander 103 has a function to expand a beam diameter of the laser beam by placing, for example, two pieces of convex lenses.

Subsequently, the laser beam passed through the expander 103 is incident on a diffractive optical element 104. Here, the expander 103 is used to relax the limitation in designs such as a cut interval of the diffractive optical element 104 by expanding the beam diameter. Therefore, when the beam diameter of the laser beam emitted from the laser oscillator is large enough, the expander 103 may be omitted. Also, the diffractive optical element 104 is used to divide the laser beam and form plural beam spots. In addition, here the example in which a transmission type diffractive optical element is used as the diffractive optical element 104 is shown; however the laser irradiation apparatus of the present invention is not limited to this structure. For example, a structure in which a reflection type diffractive optical element is placed in the optical system can be taken.

Since the diffractive optical element 104 can be designed so that each of the plural laser beams that are divided has an equal beam parameter, even if, for example, a laser beam having a Gaussian energy distribution is used, the use of the diffractive optical element can realize formation of plural laser beams each having equal energy. Accordingly, each light-exposure time by the plural laser beams can be homogenized; therefore, the treatment time can be set to the minimum. In addition, the diffractive optical element is to control a behavior of the laser beam by its diffraction phenomenon of a surface structure. The diffractive optical element can be designed by an ORA (Optimal Rotation Angle) method and the like that optimize a phase distribution. In addition, the diffractive optical element can be also automatically designed by optical design software which can perform wave-optics analysis. As a physical shape of the diffractive optical element, binary phase grating, multilevel phase grating, continuous phase grating, and the like can be applied.

Figure 2:
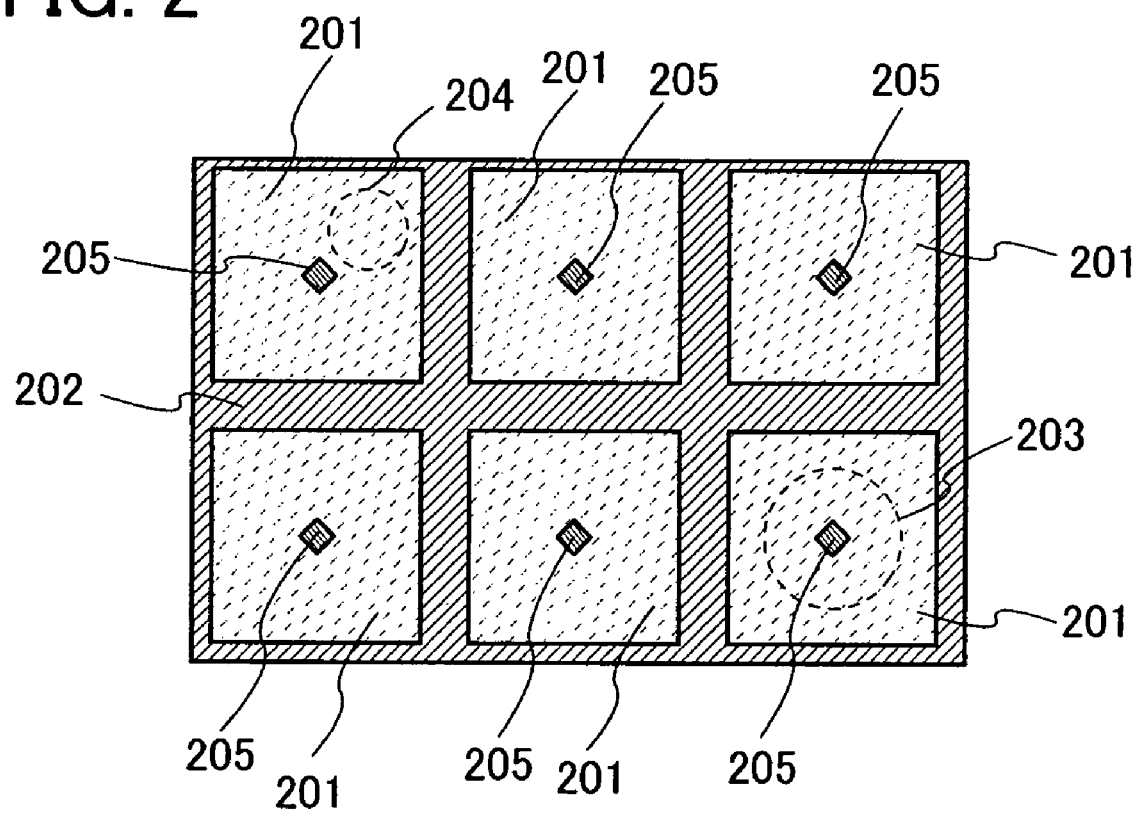
FIG. 2 is a diagram showing a laser irradiation pattern.

Subsequently, the laser beams divided by the diffractive optical element 104 are each converged on a DMD 105. The number of micromirrors structuring the DMD is preferably equal to or more than the number of laser beams divided by the diffractive optical element, and each of the laser beams is converged on a different micromirror. In addition, the laser beam is reflected by the micromirror so as to be deflected in the direction of a projection lens 106. Here, in order to describe an incidence position of the laser beam on the micromirror, a part of a top surface of the DMD is shown in FIG. 2. In FIG. 2, reference numeral 201 denotes a micromirror structuring the DMD. In addition, in FIG. 2, a DMD having six pieces of the micromirrors 201 is described; however, the number of the micromirrors is not limited to this. In addition, a region denoted by reference numeral 202 is a region between the mirrors, and incidence of a laser beam on the region 202 between the mirrors causes stray light. In addition, there is also a problem that when the laser beam goes into the device through the region 202 between the mirrors, temperature increase and a damage on the device are caused, which bring about an operational defect such as chattering. Thus, in the laser irradiation apparatus of this invention, a beam spot is divided by the diffractive optical element, and the laser beam is converged in a spot size smaller than the micromirror 201. For example, it is preferable to converge the laser beam in a central portion of the micromirror 201 as shown by a spot 203 drawn with a dotted line in the figure. Here, when the micromirror 201 has shape deformation, the shape deformation is particularly large in the four corners of the micromirror. Therefore, fluctuation of the beam spot shape caused by the shape deformation can be prevented by convergence of the laser beam in the central portion of the micromirror 201. In addition, in a region 205 which is the central portion of the micromirror 201, a hinge which is connected to a yoke, i.e., an angle adjuster of the micromirror is formed. Therefore, in a case where the fluctuation of the beam spot shape is caused by the hinge, in order to avoid the region 205, the structure may be such that the beam spot is converged between the central portion of the micromirror and the four corners of the micromirror, such as a position 204. Note that in a case of forming a beam spot at such a position, the diameter of the beam spot is necessarily converged to about several μm. In this case, although not shown in a figure, a structure in which a beam spot formed by the diffractive optical element 104 is reduction-projected on the DMD 105 by a projection optical system may be taken. With the above structure, in the DMD 105, loss of the laser beam caused by the stray light and the like can be prevented and use efficiency of the laser beam can be improved.

Subsequently, the laser beam which is reflected by the DMD 105 so as to be deflected in the direction of an irradiated surface is incident on the projection lens 106 (FIG. 1). The projection lens 106 is placed so as to project a beam spot formed on the DMD 105 to a substrate 108 that is the irradiated surface. Therefore, the projection lens 106 is placed at a position where the DMD 105 and the substrate 108 conjugate with each other. Here, the setting angles of plural micromirrors which structure the DMD 105 are digitally controlled. For example, when laser irradiation is performed over a substrate, the tilt angle of the micromirror is set to +10 degrees, and when laser irradiation is not performed, the tilt angle of the micromirror is set to −10 degrees. When the tilt angle of the micromirror is set to −10 degrees, a laser beam reflecting off the micromirror reaches a light blocking plate 107 and is blocked; therefore the surface of the substrate 108 is not irradiated. With the above structure, a case where irradiation of the substrate 108 with the laser beam is performed (on) and a case where the irradiation is not performed (off) can be controlled; therefore, a desired irradiation pattern can be formed over the substrate 108.

In this embodiment mode, the substrate 108 is sucked by a suction stage 109. Further, the suction stage 109 is provided over a transfer stage 110 which operates in a direction of X and a transfer stage 111 which operates in a direction of Y. Accordingly, when irradiation of one light-exposure region is completed, the transfer stage 110 or the transfer stage 111 is operated and irradiation of a desired pattern can be performed to a new light-exposure region. By repetition of this cycle, the laser irradiation can be performed to the entire surface of the substrate. In this embodiment mode, the substrate 108 is stabilized on the suction stage 109; however, a stabilizing method is not limited to this, and other methods by which a substrate is pressed on a stage from above by a simple fixture and the like may be used.

By performance of laser irradiation by the method described in this embodiment mode, a laser irradiation pattern can be changed at high speed and laser irradiation can be performed efficiently over a substrate. The laser irradiation apparatus of this invention can irradiate with plural laser beams to conduct a light-exposure process; therefore, by application to a manufacturing process of a product such as a ROM in which a light-exposure pattern is frequently changed, productivity can be improved. For example, when applied to a manufacturing process of ROMs of ID chips and the like, ID chips having plural patterns can be mass-produced at low cost.

Embodiment Mode 2

In this embodiment mode, an example in which a laser beam is divided into plural number by a reflection type diffractive optical element and is incident on a DMD to perform laser irradiation is described.

Figure 3:
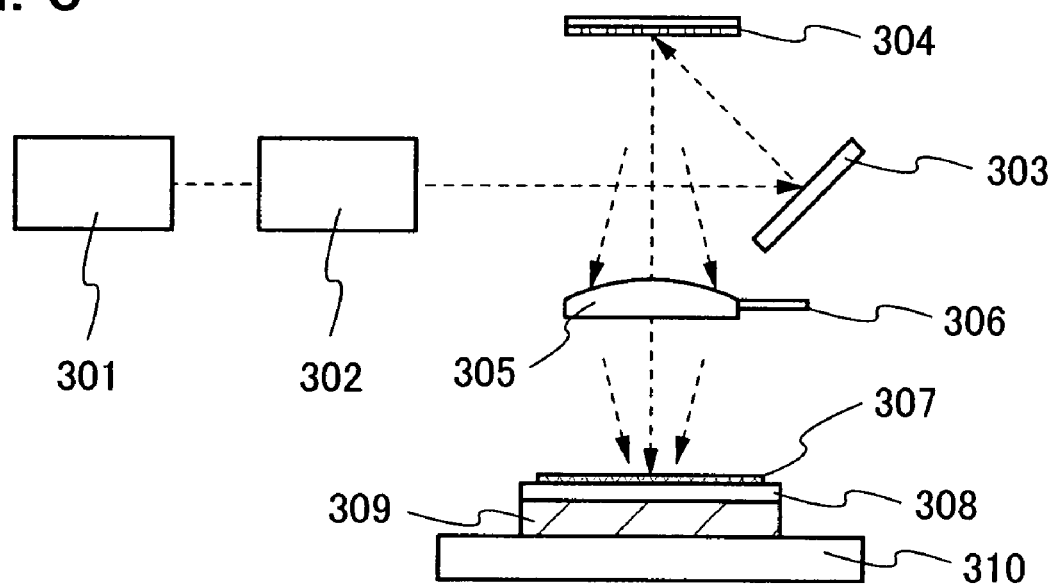
FIG. 3 is a diagram showing a structure of a laser irradiation apparatus.

FIG. 3 shows a schematic diagram of a laser irradiation apparatus of this embodiment mode. In FIG. 3, a laser beam which is emitted from a laser oscillator 301 is incident on an expander 302. In addition, dotted-line arrows in FIG. 3 indicate the traveling directions of the laser beam. The expander 302 has a function to expand the beam diameter of the laser beam by placing, for example, two convex lenses. The laser beam which has passed through the expander 302 is incident on a reflection type diffractive optical element 303. Here, the expander 302 is used to relax limitation in designs such as a cut interval of the diffractive optical element 303. Therefore, when the beam diameter of the laser beam emitted from the laser oscillator is large enough, the expander 302 may be omitted. In addition, the diffractive optical element 303 is used to divide the laser beam and form the plural beam spots. In addition, since the diffractive optical element 303 can be designed so that each of the plural beam spots that are divided has an equal beam parameter, even if, for example, a laser beam having a Gaussian energy distribution is used, the use of the diffractive optical element can realize formation of plural laser beams each having equal energy. Accordingly, each light-exposure time by each of the plural laser beams can be homogenized; therefore the treatment time can be set to the minimum. In addition, the diffractive optical element used here is to control a behavior of the laser beam by its diffraction phenomenon of a surface structure. The diffractive optical element can be designed by an ORA (Optimal Rotation Angle) method and the like that optimize a phase distribution. In addition, the diffractive optical element can be also automatically designed by optical design software which can perform wave-optics analysis. As a physical shape of the diffractive optical element, binary phase grating, multilevel phase grating, continuous phase grating, and the like can be applied.

Subsequently, the laser beams divided by the diffractive optical element 303 are each converged on a DMD 304. The number of micromirrors structuring the DMD is preferably equal to or more than the number of laser beams divided by the diffractive optical element, and each of the laser beams is converged on a different micromirror.

Subsequently, the laser beam which is reflected by the DMD 304 so as to be deflected in a direction of an irradiated surface is incident on a projection lens 305 (FIG. 3). The projection lens 305 is placed to project a beam spot formed on the DMD 304 to a substrate 307 that is the irradiated surface.

Therefore, the projection lens 305 is placed at a position where the DMD 304 and the substrate 307 conjugate with each other. Here, the setting angles of plural micromirrors which structure the DMD 304 are digitally controlled. For example, when laser irradiation is performed over a substrate, the tilt angle of the micromirror is set to +10 degrees, and when laser irradiation is not performed, the tilt angle of the micromirror is set to −10 degrees. When the tilt angle of the micromirror is set to −10 degrees, a laser beam reflecting off the micromirror reaches a light blocking plate 306 and is blocked; therefore irradiation is not performed over the substrate 307. With the above structure, a case where irradiation of the substrate 307 with the laser beam is performed (on) and a case where the irradiation is not performed (off) can be controlled; therefore, a desired irradiation pattern can be formed over the substrate 307. In this embodiment mode, since an image of the diffractive optical element 303 is formed on the DMD 304, the DMD 304 and the irradiated surface conjugated with each other; however, the image of the diffractive optical element is not necessarily formed on the DMD, and the image of the diffractive optical element may be formed over the irradiated surface with the image of the diffractive optical element and the irradiated surface conjugating with each other.

In this embodiment mode, the substrate 307 is sucked by a suction stage 308. Further, the suction stage 308 is provided over a transfer stage 309 which operates in a direction of X and a transfer stage 310 which operates in a direction of Y. Accordingly, when irradiation of one light-exposure region is completed, the transfer stage 309 or the transfer stage 310 is operated and irradiation of a desired pattern can be performed to a new light-exposure region. By repetition of this cycle, the irradiation can be performed to the entire surface of the substrate. In this embodiment mode, the substrate 307 is stabilized on the suction stage 308; however, a stabilizing method is not limited to this, and other methods by which a substrate is pressed on a stage from above by a simple fixture and the like may be used.

By performance of laser irradiation by the method described in this embodiment mode, a laser irradiation pattern can be changed at high speed and laser irradiation can be performed efficiently over a substrate. The laser irradiation apparatus of this invention can irradiate with plural laser beams to conduct a light-exposure process; therefore, by application to a manufacturing process of a product such as a ROM in which a light-exposure pattern is frequently changed, productivity can be improved. For example, when applied to a manufacturing process of ROMs and the like of ID chips, ID chips having plural patterns can be mass-produced at low cost.

Embodiment Mode 3

In this embodiment mode, described is an example in which laser beams that are reflected by a DMD in two directions are transferred to different regions on an irradiated surface to perform laser irradiation with improved throughput.

Figure 4:
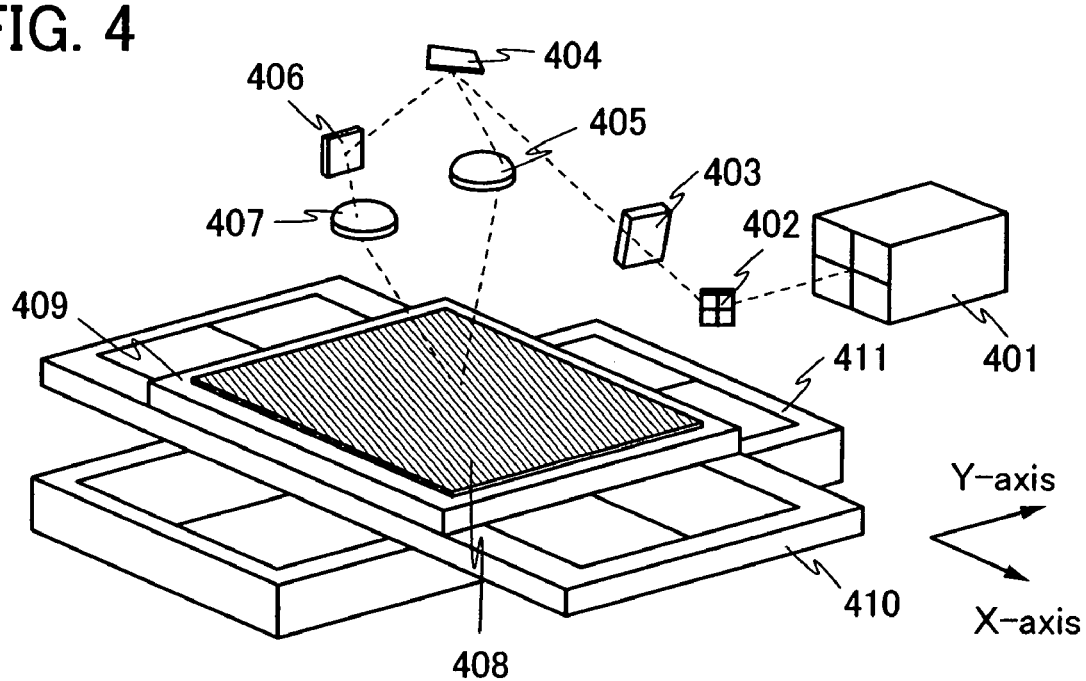
FIG. 4 is a diagram showing a structure of a laser irradiation apparatus.

A perspective diagram of a laser irradiation apparatus of this embodiment mode is shown in FIG. 4. A laser beam emitted from a laser oscillator 401 is deflected by a mirror 402. The deflected laser beam passes through a diffractive optical element 403. The diffractive optical element 403 is used to divide the laser beam and form plural beam spots. Since the diffractive optical element 403 can be designed so that each of the plural laser beams that are divided has an equal beam parameter, even if, for example, a laser beam having a Gaussian energy distribution is used, the use of the diffractive optical element can realize formation of plural beam spots each having equal energy. Accordingly, each light-exposure time by the plural laser beams can be homogenized; therefore the treatment time can be set to the minimum. In addition, the diffractive optical element used here is to control a behavior of the laser beam by its diffraction phenomenon of a surface structure. The diffractive optical element can be designed by an ORA (Optimal Rotation Angle) method and the like that optimize a phase distribution. In addition, the diffractive optical element can be also automatically designed by optical design software which can perform wave-optics analysis. As a physical shape of the diffractive optical element, binary phase grating, multiple phase grating, continuous phase grating, and the like can be applied.

Subsequently, the laser beams divided by the diffractive optical element 403 are each converged on a DMD 404. The number of micromirrors structuring the DMD 404 is preferably equal to or more than the number of laser beams divided by the diffractive optical element, and each of the laser beams is converged on a different micromirror. With the above structure, in the DMD 404, loss of the laser beam caused by the stray light and the like can be prevented and use efficiency of the laser beam can be improved.

The angles of reflecting surfaces of plural micromirrors which structure the DMD 404 can be digitally controlled. In this embodiment mode, described is a DMD in which the tilt angle of each of the plural micromirrors structuring the DMD can be set to +12 degrees or −12 degrees. In this embodiment mode, when the tilt angle of the micromirror is set to +12 degrees, a laser beam reflecting off the DMD 404 passes through a projection lens 405. Note that the projection lens 405 has a function to transfer an image on the DMD 404 to an irradiated surface and can perform laser irradiation by projection of a beam spot formed on the micromirror having a tilt angle of +12 degrees onto the substrate 408. On the other hand, when the tilt angle of the micromirror is set to −12 degrees, a laser beam reflecting off the DMD is reflected again by a mirror 406. The laser beam reflected off the mirror 406 passes through a projection lens 407. The projection lens 407 has a function to transfer an image on the DMD to an irradiated surface and can perform laser irradiation by projection of a beam spot formed on the micromirror having a tilt angle of −12 degrees onto the substrate 408. As mentioned above, by laser irradiation to a desired position over a substrate with the use of the DMD 404, ID chips and the like having unique patterns can be manufactured.

Here, described with reference to FIGS. 5A and 5B is an optical path of a laser beam from when it is incident on the DMD 404 to when the substrate 408 is irradiated with it. Each of FIGS. 5A and 5B is a schematic diagram of a cross section between the DMD 404 and the substrate 408. Note that the directions indicated by dotted-line arrows are traveling directions of the laser beam. FIG. 5A is a diagram of an optical path when the tilt angle of a micromirror is +12 degrees, in other words, the laser beam delivered through the DMD 404 and the projection lens 405 to the substrate 408. Note that in FIG. 5A, in order to simplify the description, a laser beam delivered to a point 508 which is the center of the DMD 404 is described. A laser beam reflected off the DMD 404 is deflected with an angle of +24 degrees in a direction that is perpendicular to the paper (direction of Y-axis). In addition, if the incidence angle of the laser beam is set to θ in the drawing, the laser beam is deflected at a reflection angle of θ in a direction of X-axis and travels along an optical path 501. Furthermore, the laser beam is incident on the projection lens 405. The projection lens 405 is provided so that a central axis 503 thereof passes through the central position of the DMD 404. In addition, the projection lens 405 is placed at a position where the DMD 404 and the substrate 408 conjugate with each other. With the above structure, on the substrate 408, the laser beam is transferred to a point 504 which is directly under the DMD 404.

FIG. 5B is a diagram of an optical path when the tilt angle of a micromirror is −12 degrees, in other words, the laser beam delivered through the DMD 404, the mirror 406, and the projection lens 407 to the substrate 408. Note that in FIG. 5B, in order to simplify the description, a laser beam delivered to the point 508 which is the center of the DMD 404 is described. A laser beam reflected off the DMD 404 is deflected with an angle of −24 degrees in a direction that is perpendicular to the paper (direction of Y-axis). In addition, if the incidence angle of the laser beam is set to θ in the drawing, the laser beam is deflected at a reflection angle of θ in a direction of X-axis and travels along an optical path 502. The mirror 406 is provided in the optical path 502, and the laser beam reflected off the mirror 406 is incident on the projection lens 407. The projection lens 407 is placed at a position where the DMD 404 and the substrate 408 conjugate with each other. Here, the mirror 406 is placed such that its reflecting surface is perpendicular to the irradiated surface of the laser beam. Accordingly, the optical path 501 and the optical path 502 can be made equal distance. Therefore, lenses having the same focal distance can be used for the projection lenses 405 and 407. In addition, the structures of FIGS. 5A and 5B have equal projection magnification to each other.

In addition, in the structure of FIG. 5B, since the laser beam is deflected by the mirror 406 in the optical path, a position of the laser beam delivered onto the substrate 408 can be adjusted. For example, when the laser beam reflected off the mirror 406 is extended to an opposite side of a traveling direction of the laser beam, it intersects at a point 505 with a straight line that is extended from a position of the DMD 404 to a direction that is parallel to the paper. Here, a segment from the mirror 406 to the point 505 and a segment from a point 508 of the optical path 502 to the mirror 406 are axisymmetric along the mirror 406. Therefore, the point 508 that is the center of the DMD 404 can be virtually considered as being positioned at the point 505. Here, if the distance from the center of the DMD 404 to the point 505 is d, a central axis 506 of the projection lens is placed at a position which is apart from the central axis 503 of the DMD 404 for a distance of d. Accordingly, the laser beam can be transferred to the point 507 which is approximately right under the point 505. By the structure of an optical system of FIGS. 5A and 5B according to above method, different irradiation patterns can be formed in two regions respectively at the same time.

The substrate 408 where the irradiation pattern is to be formed is sucked by a suction stage 409. Further, the suction stage 409 is provided over a transfer stage 410 which operates in a direction of X and a transfer stage 411 which operates in a direction of Y. Accordingly, when irradiation of one light-exposure region is completed, the transfer stage 410 or the transfer stage 411 is operated and laser irradiation with a desired pattern can be performed to a new light-exposure region. By repetition of this cycle, the laser irradiation can be performed to the entire surface of the substrate. In this embodiment mode, the substrate is stabilized on the suction stage 409; however, a stabilizing method is not limited to this, and other methods by which a substrate is pressed on a stage from above by a simple fixture and the like may be used.

Figure 6:
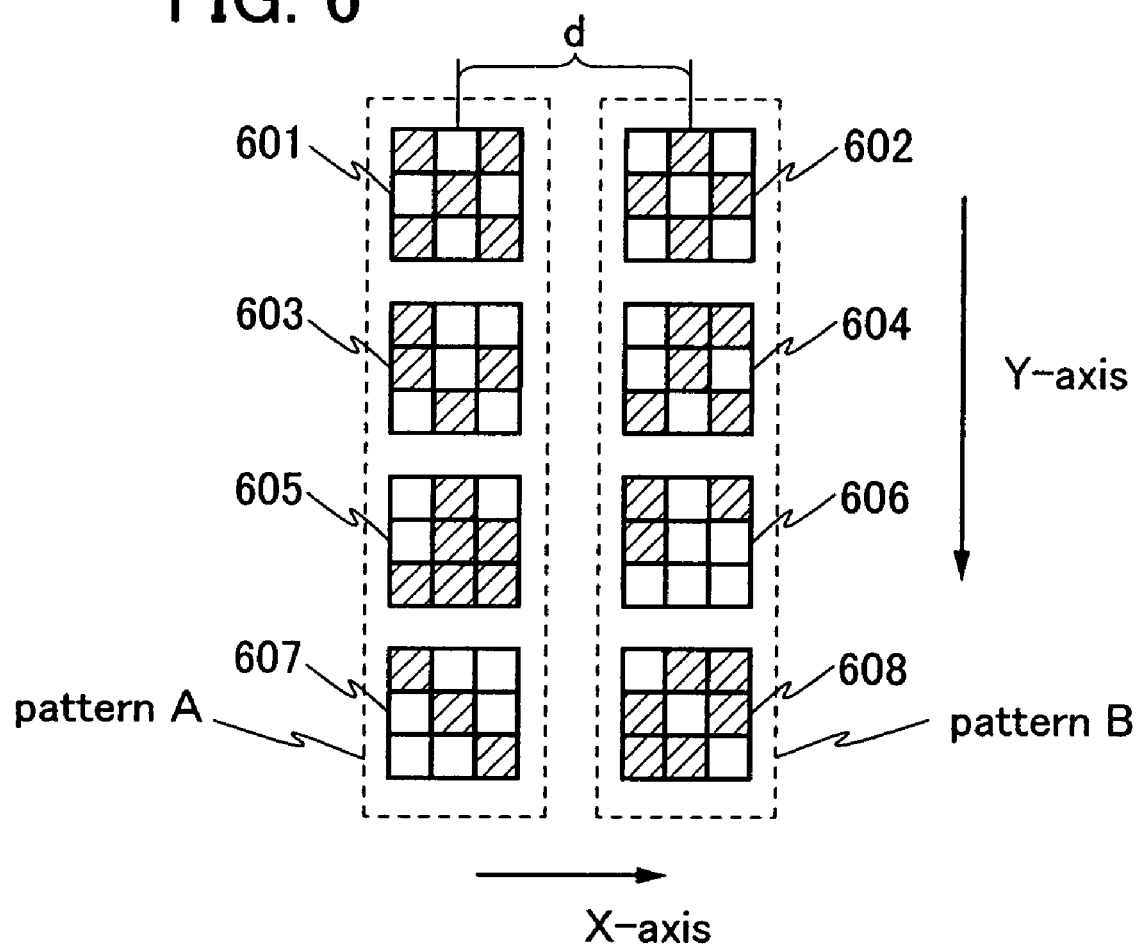
FIG. 6 is a diagram showing a laser irradiation pattern.

Here, described is an irradiation pattern formed on an irradiated surface with FIG. 6 shown as an example. FIG. 6 shows an example of formation of an imaging pattern of three rows×three columns. A pattern A (601, 603, 605, and 607) is an irradiation pattern formed by the structure of FIG. 5A. In addition, a pattern B (602, 604, 606, and 608) is an irradiation pattern formed by the structure of FIG. 5B. In the patterns A and B, the area indicated by slanted lines is an area where laser irradiation is performed, and the pattern A and the pattern B are reverse patterns to each other. For example, the irradiation pattern 602 is a pattern in which laser irradiation is performed only to a part corresponding to a non-irradiation area of the irradiation pattern 601. In addition, a center of the pattern A and a center of the pattern B are formed apart from each other for a distance of d in the direction of X-axis. Accordingly, different irradiation patterns can be formed simultaneously. Therefore, when laser irradiation is performed while the substrate is transferred in the direction of Y-axis in the figure, laser irradiation can be performed while the pattern A and the pattern B are being formed simultaneously, and throughput is thus improved.

By performance of laser irradiation by the method described above, a laser irradiation pattern can be changed at high speed and laser irradiation can be performed efficiently over a substrate. In addition, a method for making such an irradiation pattern is particularly suitable for the manufacturing of ID chips and the like which require formation of a random irradiation pattern. Therefore, by application of the laser irradiation apparatus of the present invention to a manufacturing process of ROMs for ID chips and the like, ID chips having plural patterns can be mass-produced at low cost.

Embodiment 1

Figure 7:
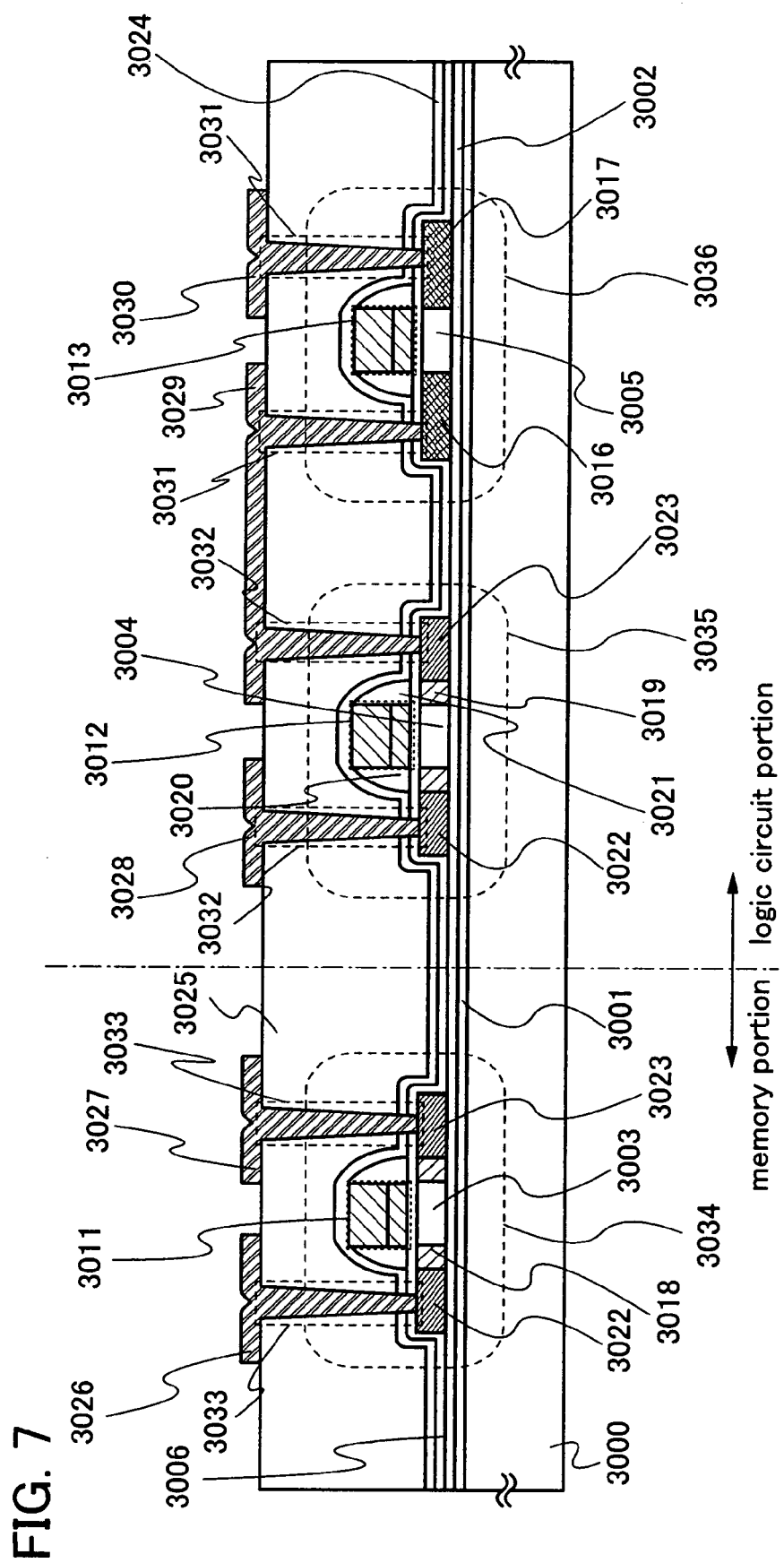
FIG. 7 is a diagram showing a cross section of a semiconductor device.

In this embodiment, with reference to FIG. 7, a method of manufacturing TFTs over an insulating substrate, which are used for a nonvolatile memory circuit, a modulation circuit, a demodulation circuit, a logic circuit, and the like is described. Note that in this embodiment, an N-channel thin film transistor (a thin film transistor is hereinafter referred to as a TFT), and a P-channel TFT are taken as examples of semiconductor elements included in a memory portion and a logic circuit portion, though the invention is not limited to this. In addition, the manufacturing method shown in this embodiment is just an example, and does not limit a manufacturing method of a semiconductor element over an insulating substrate. Note that the TFT manufactured in this embodiment uses a method called contact writing which judges the binary information of "0" or "1" based on whether a transistor is connected to a bit line or not when data is stored in a memory portion.

First, base films 3001 and 3002 are formed over an insulating substrate 3000 formed of glass by using an insulating film such as a silicon oxide film, a silicon nitride film, a silicon oxynitride film, and a silicon nitride oxide film. For example, a silicon oxynitride film with a thickness of 10 to 200 nm is formed as the base film 3001, and a hydrogenated silicon oxynitride film with a thickness of 50 to 200 nm is formed thereon as the base film 3002.

Next, a semiconductor film with an amorphous structure is formed over the base film 3002, and the semiconductor film is crystallized by a laser crystallization method or a thermal crystallization method to form a crystalline semiconductor film. Subsequently, the crystalline semiconductor film is processed to form island shape semiconductor layers 3003, 3004, and 3005. Each of the island shape semiconductor layers 3003 to 3005 has a thickness of about 25 to 80 nm. The material of the crystalline semiconductor film is not limited, though silicon, a silicon-germanium (SiGe) alloy, or the like is preferably used.

Subsequently, a gate insulating film 3006 is formed so as to cover the island shape semiconductor layers 3003, 3004, and

3005. The gate insulating film 3006 is formed of an insulating material containing silicon by a plasma CVD method or a sputtering method so as to have a thickness of about 10 to 80 nm.

In addition, a first conductive layer is formed over the gate insulating film 3006. Then, a second conductive layer is formed, and the lamination of the first conductive layer and the second conductive layer is etched at a time, whereby gate electrodes 3011, 3012, and 3013 of TFTs are formed.

In this embodiment, the first conductive layer is formed of TaN with a thickness of 50 to 100 nm while the second conductive layer is formed of W with a thickness of 100 to 300 nm. However, the material of the conductive layers is not limited, and each may be formed of an element selected from Ta, W, Ti, Mo, Al, Cu and the like, or an alloy or a compound mainly containing the aforementioned element.

Subsequently, a P-channel TFT used for the logic circuit portion is doped with an element imparting P-type conductivity, thereby forming first impurity regions 3016 and 3017. Then, N-channel TFTs used for the memory portion and the logic circuit portion are doped with an element imparting N-type conductivity, thereby forming second impurity regions 3018 and 3019 as LDD regions. Then, sidewalls 3020 and 3021 are formed and the N-channel TFTs used for the memory portion and the logic circuit portion are doped with an element imparting N-type conductivity, thereby forming third impurity regions 3022 and 3023. Such doping steps may be performed by an ion doping method or an ion implantation method. Through these steps, the impurity regions are formed in the island shape semiconductor layers 3003, 3004, and 3005.

The impurity elements added to the island shape semiconductor layers 3003, 3004, and 3005 are activated. This step is performed by a thermal annealing method using an annealing furnace. Further, a laser annealing method or a rapid thermal annealing (RTA) method may be adopted. Alternatively, the island shape semiconductor layers are hydrogenated by applying heat treatment at a temperature of 300 to 450° C. for 1 to 12 hours in an atmosphere containing 3% or more of hydrogen. Plasma hydrogenation (using hydrogen excited by plasma) may be performed as another means of hydrogenation.

A first interlayer insulating film 3024 is formed of a silicon oxynitride film. The thickness of the first interlayer insulating film 3024 is set 10 to 80 nm similarly to that of the gate insulating film. Then, a second interlayer insulating film 3025 is formed of an organic insulating material such as acrylic. Instead of the organic insulating material, an inorganic material may also be used for the second interlayer insulating film 3025. As the inorganic material, inorganic $SiO_2$, $SiO_2$ obtained by a plasma CVD method, i.e., $PCVD-SiO_2$, a silicon oxide film applied by a SOG (Spin On Glass) method, or the like is used.

Subsequently, a resist is provided over the entire surface of the second interlayer insulating film 3025 by a spin coating method, and contact holes 3031 and 3032 are formed in the gate insulating film 3006, the first interlayer insulating film 3024, and the second interlayer insulating film 3025 (FIG. 7). In this embodiment, areas other than the memory portion of a nonvolatile memory circuit are etched by a first light-exposing means (e.g., mirror projection light-exposure, step and repeat light-exposure (stepper light-exposure), step and scan light-exposure, and the like). By the aforementioned first light-exposing means, the resist which is provided over the second interlayer insulating film 3025 is light-exposed to form a pattern, and etching is performed using the resist as a mask. In this step, first, a resist is applied onto the second interlayer insulating film 3025 and baking is performed as shown in Step (A) of FIG. 8. Next, areas other than the memory portion of the nonvolatile memory circuit are light-exposed by light-exposing the resist by the aforementioned first light-exposing means, in other words, mirror projection light-exposure, step and repeat light-exposure, step and scan light-exposure, and the like, thereby forming a pattern (Step (B) of FIG. 8). The light-exposing means like this is very effective for forming a number of the same patterns.

Figure 8:
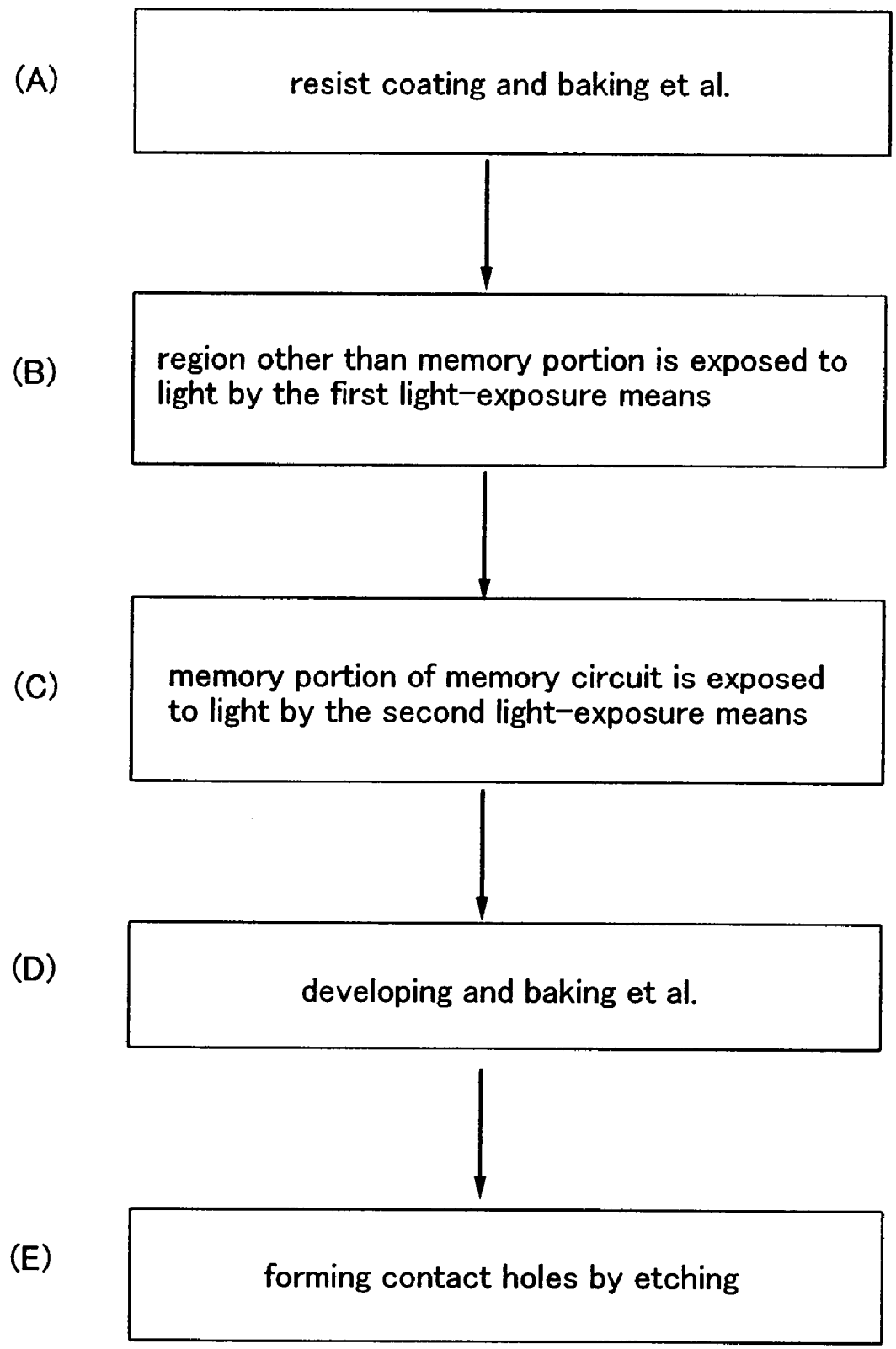
FIG. 8 is a diagram showing the flow of a manufacturing method of a semiconductor device.

Subsequently, patterns of contact holes in the memory portion of the nonvolatile memory circuit, or contact holes in the memory portion and a part of a chip are formed by light-exposing the resist by a second light-exposing means using the laser irradiation apparatus of Embodiment Modes 1 to 3 (Step (C) of FIG. 8). A contact hole 3033 in FIG. 7 is formed by the second light-exposing means.

Subsequently, after processes of development and the like are performed (Step (D) of FIG. 8), the interlayer films are etched, and the contact holes 3031, 3032, and 3033 which are patterned by the first light-exposing means and the second light-exposing means are formed (Step (E) of FIG. 8).

In addition, in the memory portion, electrodes 3026 and 3027 in contact with a source region and a drain region of the island shape semiconductor layer are formed. In addition, in the logic circuit portion as well, electrodes 3028, 3029, and 3030 are formed.

In the above description, in the process of forming the contact holes, the first light-exposing means (e.g., mirror projection light-exposure, step and repeat light-exposure, or step and scan light-exposure) and the second light-exposing means (light-exposing method using the method of laser irradiation described in any of Embodiment Modes 1 to 3) are combined to form a plurality of contact holes over the same substrate; however, the aforementioned method is not limited to the process of forming the contact holes, but can be used in a process of forming source wiring or drain wiring, a doping process, or the like. In addition, the first light-exposing means and the second light-exposing means are not necessarily combined, and the second light-exposing means can be used in every light-exposing process. By using the second light-exposing means, a laser irradiation pattern can be changed at high speed while the laser irradiation is performed at high speed to a desired position, and a manufacturing time of a semiconductor device is shortened and precise manufacturing can be realized.

In addition, after the first light-exposing means, the second light-exposing means is used in the above description; however, first, the memory portion may be formed by the second light-exposing means, and later other circuit portions may be formed by the first light-exposing means.

As aforementioned, the memory portion having a memory element 3034, and the logic circuit portion including an N-channel TFT 3035 with an LDD structure and a P-channel TFT 3036 with a single drain structure can be formed over the same substrate (refer to FIG. 7).

Figure 9:
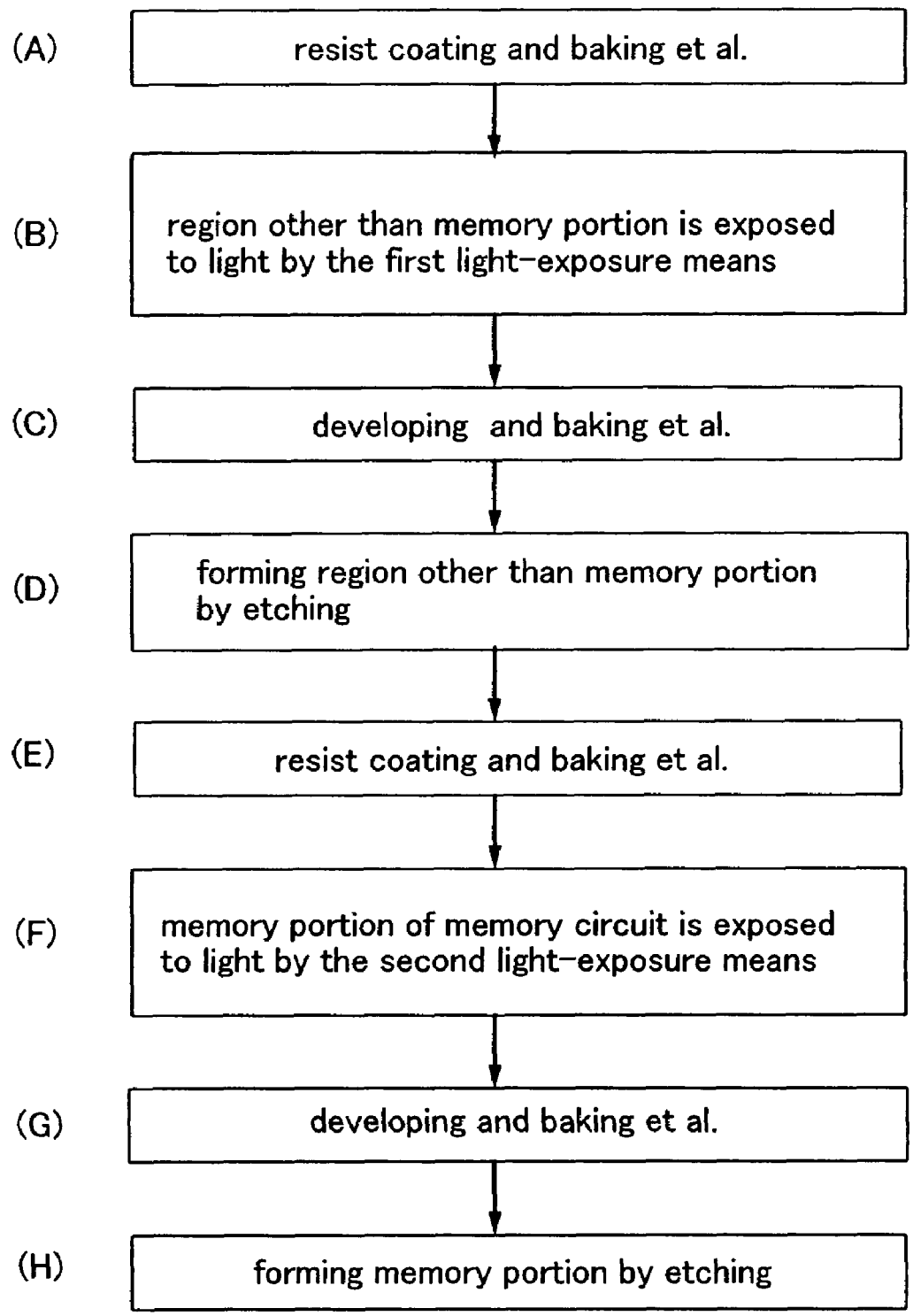
FIG. 9 is a diagram showing the flow of a manufacturing method of a semiconductor device.

In addition, as shown in a flow chart of FIG. 9, once areas other than a memory portion may be formed, and later a memory portion of a nonvolatile memory circuit may be formed. A process shown in FIG. 9 is; first, a resist is applied onto the second interlayer insulating film 3025 and baking is performed (Step (A) of FIG. 9). Subsequently, the resist is light-exposed to form a pattern in the areas other than the memory portion by the first light-exposing means (mirror projection light-exposure, step and repeat light-exposure, step and scan light-exposure, and the like) (Step (B) of FIG. 9). Subsequently, development, baking, and the like of the resist that is light-exposed by the first light-exposing means are performed (Step (C) of FIG. 9). Subsequently, etching is performed and a pattern of the areas other than the memory portion is formed (Step (D) of FIG. 9). Next, once again a resist is applied over the interlayer insulating film 3025, and baking is performed (Step (E) of FIG. 9). Subsequently, in order to form a pattern of a memory portion of a nonvolatile memory circuit, the resist is light-exposed by the second light-exposing means using the light-exposure apparatus shown in any of Embodiment Modes 1 to 3 (Step (F) of FIG. 9). Next, development and baking of the resist that is light-exposed by the second light-exposing means are performed (Step (G) of FIG. 9). Lastly, etching is performed and the memory portion of the nonvolatile memory circuit is formed (Step (H) of FIG. 9). In this manner, data that is different for each chip can be stored, and semiconductor devices can be manufactured without lowering throughput. The laser irradiation apparatus described in any of Embodiment Modes 1 to 3 is capable of performing laser irradiation on plural complex irradiated points precisely at one time. Therefore, the laser irradiation can be performed efficiently in a manufacturing process of a device which requires laser irradiation to plural irradiated points such as a manufacturing process of a ROM. Therefore, mass-productivity of the manufacturing of ROMs of ID chips and the like can be easily improved.

Embodiment 2

In this embodiment, a manufacturing method up to the step of transferring a memory portion and a logic circuit portion to a flexible substrate is described with reference to FIGS. 10A to 11B. Although a nonvolatile memory element, an N-channel TFT, and a P-channel TFT are taken as examples of the semiconductor elements included in the memory portion and the logic circuit portion in this embodiment, the present invention is not limited to this. In addition, the method of manufacturing the semiconductor elements over an insulating substrate shown here is just an example, and does not limit the present invention.

First, a peeling layer 4000 is formed over the insulating substrate 3000 as shown in FIGS. 10A and 10B. The peeling layer 4000 can be formed by a sputtering method, a plasma CVD method, or the like using a layer containing silicon as its main component, such as amorphous silicon, polycrystalline silicon, single crystalline silicon, or microcrystalline silicon (including semi-amorphous silicon). In this embodiment, the peeling layer 4000 is formed of amorphous silicon with a thickness of about 500 nm by a sputtering method. Subsequently, the base film 3001 is formed over the peeling layer 4000, and then a memory portion including the storage element 3034 and a logic circuit portion including the N-channel TFT 3035 and the P-channel TFT 3036 are formed similarly to the manufacturing steps shown in Embodiment 1.

Subsequently, a third interlayer insulating film 4001 is formed over the second interlayer insulating film 3025, and pads 4002 to 4005 are formed using a conductive material which includes one or more of metals selected from Ag, Au, Cu, Pd, Cr, Mo, Ti, Ta, W, Al, and the like, or metal compounds.

A protective layer 4006 is formed over the third interlayer insulating film 4001 so as to cover the pads 4002 to 4005. The protective layer 4006 is formed of a material that can protect the pads 4002 to 4005 when the peeling layer 4000 is etched away. For example, the protective layer 4006 can be formed by applying over the entire surface an epoxy-based resin, an acrylate-based resin, or a silicone-based resin that is soluble in water or alcohols (FIG. 10A).

Next, a groove 4007 for separating the peeling layer 4000 is formed to such a degree that the peeling layer 4000 is exposed (see FIG. 10B). The groove 4007 can be formed by a method of etching, dicing, scribing, or the like.

Figures 11A, 11B:
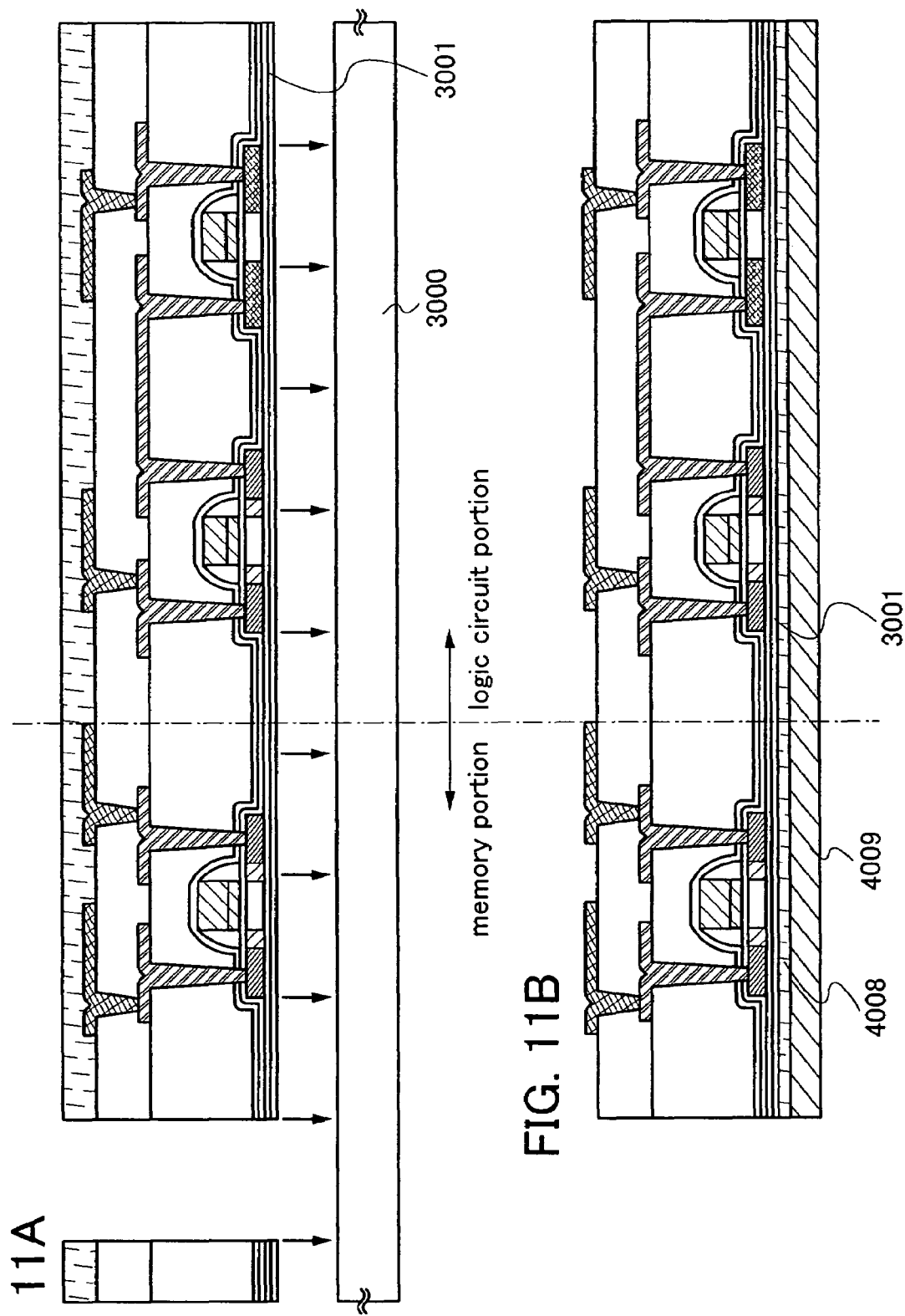
FIGS. 11A and 11B are diagrams showing a manufacturing process of a semiconductor device.

Subsequently, the peeling layer 4000 is etched away (FIG. 11A). In this embodiment, halogen fluoride is used as an etching gas and introduced through the groove 4007. In this embodiment, etching is performed for three hours using, for example, $ClF_3$ (chlorine trifluoride) at a temperature of 350° C., a flow rate of 300 sccm, and a pressure of 800 Pa. Alternatively, a $ClF_3$ gas mixed with nitrogen may be used as well. Selective etching is performed on the peeling layer 4000 by using halogen fluoride such as $ClF_3$, and thus the insulating substrate 3000 can be peeled off. Note that halogen fluoride may be either a gas or a liquid.

The peeled memory portion and logic circuit portion are then attached to a support base 4009 with an adhesive 4008 (see FIG. 11B). The adhesive 4008 is formed of a material capable of attaching the support base 4009 to the base film 3001. As the adhesive 4008, for example, various curable adhesives may be used such as a reactive curable adhesive, a thermosetting adhesive, a photo-curable adhesive such as an ultraviolet curable adhesive, and an anaerobic adhesive.

For the support base 4009, an organic material such as flexible paper or flexible plastic can be used. Alternatively, the support base 4009 may be formed of a flexible inorganic material. It is desirable that the support base 4009 have a high thermal conductivity of about 2 to 30 W/mK in order to disperse the heat generated in an integrated circuit.

A method of peeling off the integrated circuits in the memory portion and the logic circuit portion from the insulating substrate 3000 is not limited to the one using the etching of the layer containing silicon as its main component as shown in this embodiment, and various other methods may be adopted. For example, there are a method where a metal oxide film is formed between a substrate with high heat resistance and an integrated circuit, and the metal oxide film is weakened by crystallization to peel off the integrated circuit; a method where a peeling layer is destroyed by laser irradiation to peel off an integrated circuit from a substrate; and a method where a substrate on which an integrated circuit is formed is removed mechanically or by etching using a solution or a gas to peel off the integrated circuit from the substrate.

If an object has a curved surface and thereby a support base of an ID chip attached to the curved surface is curved so as to have a curved surface drawn by movement of a generatrix of a conical surface, a columnar surface, or the like, it is desirable to make the direction of the generatrix line be the same as the moving direction of carriers in the TFT. According to the aforementioned structure, it can be suppressed that the characteristics of the TFT are affected even when the support base is curved. By setting the proportion of an area occupied by an island-shaped semiconductor film in the integrated circuit to be in the range of about 1 to 30%, it can further be suppressed that the characteristics of the TFT are affected even when the support base is curved.

In this embodiment, the memory portion is manufactured by using the laser irradiation apparatus shown in any of Embodiment Modes 1 to 3. Therefore, a laser irradiation pattern can be changed at high speed and thus, laser irradiation can be effectively carried out in a manufacturing process of a device for which a random irradiation pattern needs to be formed, such as a ROM. Accordingly, mass-productivity in the manufacturing and the like of ROMs for ID chips can be easily improved.

Embodiment 3

Figure 12:
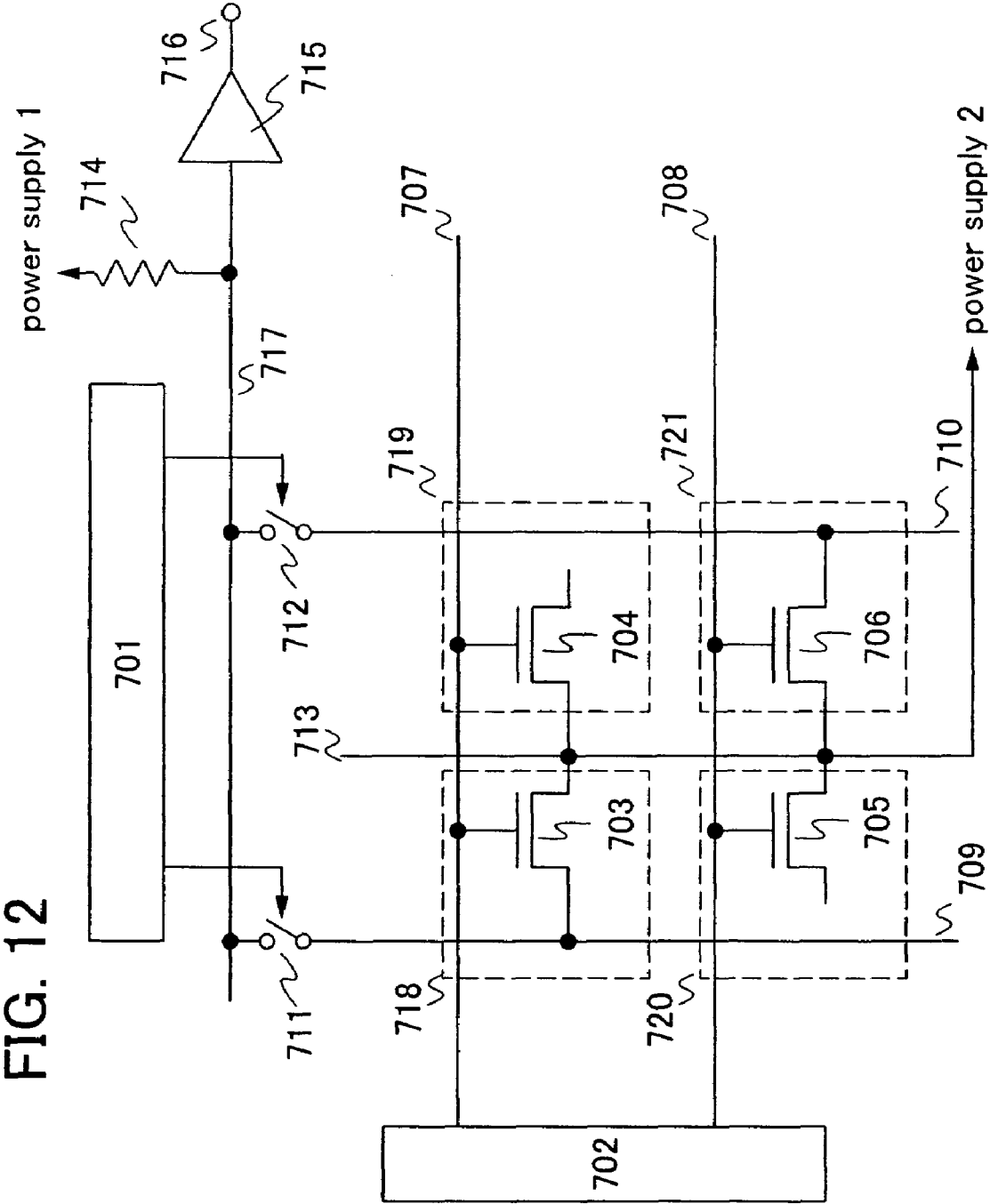
FIG. 12 is a diagram showing a structure of a non-volatile memory circuit.

An embodiment of a nonvolatile memory circuit using a mask ROM is shown in FIG. 12. The nonvolatile memory circuit shown in FIG. 12 is manufactured by using the laser irradiation apparatus of the present invention and shows the storage state depending on whether a contact hole is formed in a drain terminal of a TFT.

The operation of the nonvolatile memory circuit using a mask ROM is hereinafter described with reference to FIG. 12. In FIG. 12, a 4-bit memory circuit is shown as the nonvolatile memory circuit for simplicity of description, though the implementation of the present invention is not limited to 4 bits. The nonvolatile memory circuit shown in FIG. 12 includes a column decoder 701, a row decoder 702, an amplifier 715, N-channel TFTs 703 to 706, bit lines (data lines) 709 and 710, word lines 707 and 708, a power supply line 713, column switches 711 and 712, an output wiring 717, a load resistor 714, an output terminal 716, a power supply 1, and a power supply 2. The load resistor 714 may be replaced by a constant current source.

The power supply 1 sets a high potential whereas the power supply 2 sets a low potential. However, when the TFTs 703 to 706 are P-channel TFTs, the power supply 1 sets a low potential whereas the power supply 2 sets a high potential. In the following description, N-channel TFTs are used for the TFTs 703 to 706, and the power supply 1 supplies +3 V whereas the power supply 2 supplies 0 V, though the structure may be changed arbitrarily. Memory cells 718 to 721 are constituted by the TFTs 703 to 706, respectively.

The case of reading data is described below. When reading data of the memory cell 718, the row decoder 702 operates to activate the word line 707, whereby the TFTs 703 and 704 are turned on. Then, the column decoder 701 operates to turn on the column switch 711, whereby the bit line (data line) 709 is connected to the output wiring 717, the load resistor 714, and the amplifier 715. Since the TFT 703 is in an on state, a current flows to the power supply 2 from the power supply 1 through the load resistor 714, the output wiring 717, the column switch 711, the bit line 709, the TFT 703, and the power supply line 713. As a result, the memory cell 718 outputs a low signal.

When reading data of the memory cell 719, the row decoder 702 operates to activate the word line 707, whereby the TFTs 703 and 704 are turned on. Then, the column decoder 701 operates to turn on the column switch 712, whereby the bit line (data line) 710 is connected to the output wiring 717, the load resistor 714, and the amplifier 715. Although the TFT 703 is in an on state, a drain terminal of the TFT 704 is not connected to anywhere; thus, no current flows. Although the potential of the power supply 1 is supplied to the load resistor 714, the output wiring 717, the column switch 712, and the bit line 710, no current flows; therefore, the memory cell 719 outputs a high signal.

When reading data of the memory cell 720, the row decoder 702 operates to activate the word line 708, whereby the TFTs 705 and 706 are turned on. Then, the column decoder 701 operates to turn on the column switch 711, whereby the bit line 709 is connected to the output wiring 717, the load resistor 714, and the amplifier 715. Although the TFT 705 is in an on state, a drain terminal of the TFT 705 is not connected to anywhere; thus, no current flows. Although the potential of the power supply 1 is supplied to the load resistor 714, the output wiring 717, the column switch 711, and the bit line 709, no current flows; therefore, the memory cell 720 outputs a high signal.

When reading data of the memory cell 721, the row decoder 702 operates to activate the word line 708, whereby the TFTs 705 and 706 are turned on. Then, the column decoder 701 operates to turn on the column switch 712, whereby the bit line 710 is connected to the output wiring 717, the load resistor 714, and the amplifier 715. Since the TFT 706 is in an on state, a current flows to the power supply 2 from the power supply 1 through the load resistor 714, the output wiring 717, the column switch 712, the bit line 710, the TFT 706, and the power supply line 713. As a result, the memory cell 721 outputs a low signal. In this manner, data stored in the memory can be read out to the output terminal 716.

Embodiment 4

In this embodiment, an example of an antenna attached externally to a nonvolatile memory circuit formed by using the present invention is described with reference to FIGS. 13A to 14C.

Figure 13A:
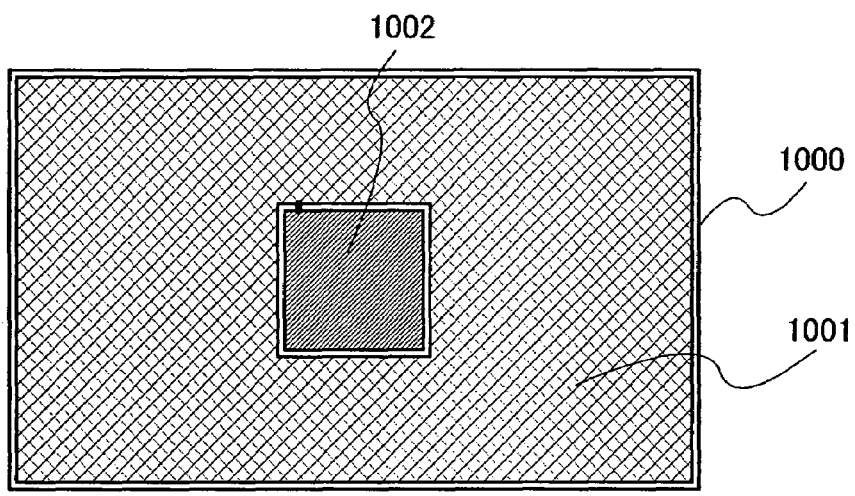
FIGS. 13A to 13E are diagrams showing an embodiment of an antenna.

FIG. 13A shows a nonvolatile memory circuit surrounded by an antenna over the entire surface. An antenna 1001 is formed over a substrate 1000, and a nonvolatile memory circuit 1002 formed using the present invention is connected to the antenna 1001. Although the periphery of the nonvolatile memory circuit 1002 is covered with the antenna 1001 in FIG. 13A, the entire surface of the substrate may be covered with the antenna 1001 and the nonvolatile memory circuit 1002 with an electrode formed may be attached thereover.

Figure 13B:
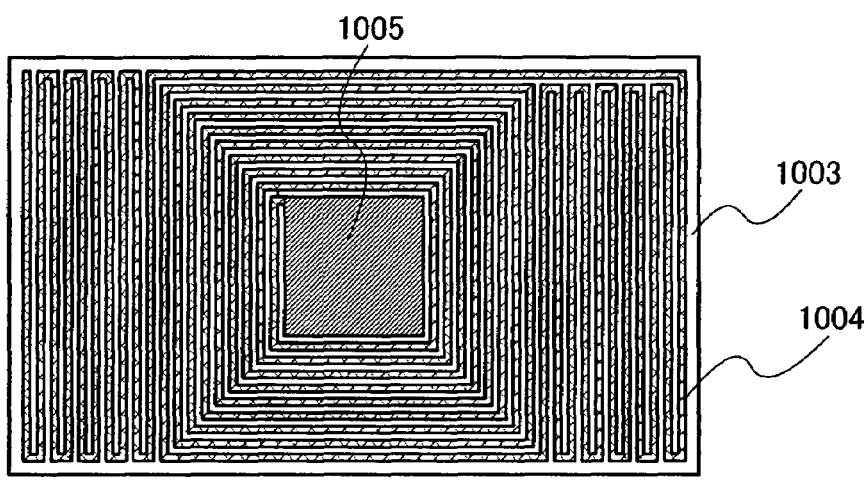

In FIG. 13B, a narrow antenna is disposed so as to circle around a nonvolatile memory circuit. An antenna 1004 is formed over a substrate 1003, and a nonvolatile memory circuit 1005 formed using the present invention is connected to the antenna 1004. Note that the arrangement of the antenna wiring shown here is just an example, and the present invention is not limited to this.

Figure 13C:
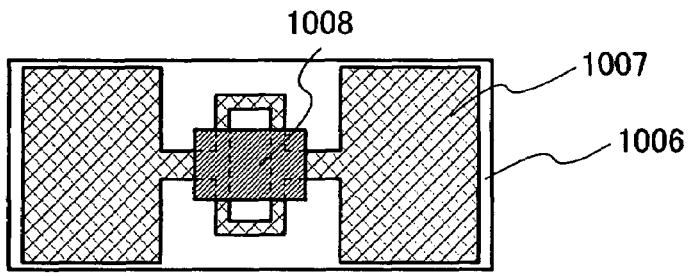

FIG. 13C shows a high-frequency antenna. An antenna 1007 is formed over a substrate 1006, and a nonvolatile memory circuit 1008 formed using the present invention is connected to the antenna 1007.

Figure 13D:
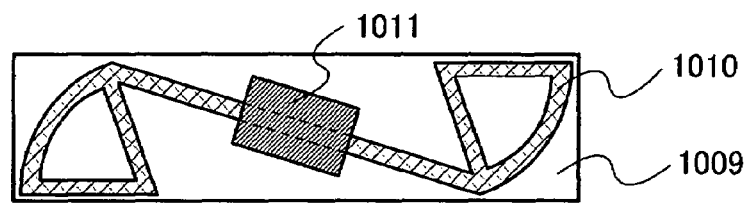

FIG. 13D shows a 180 ° omnidirectional antenna (capable of receiving electric waves equally from all directions). An antenna 1010 is formed over a substrate 1009, and a nonvolatile memory circuit 1011 formed using the present invention is connected to the antenna 1010.

Figure 13E:
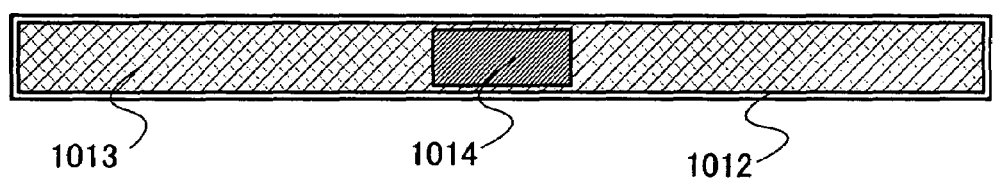

FIG. 13E shows an antenna formed in a stick shape. An antenna 1013 is formed over a substrate 1012, and a nonvolatile memory circuit 1014 formed using the present invention is connected to the antenna 1013.

The nonvolatile memory circuit formed using the present invention can be connected to any of these antennas by a known method. For example, the nonvolatile memory circuit and the antenna may be connected by wire bonding or bump bonding. Alternatively, a surface of the nonvolatile memory circuit formed as a chip may be used as an electrode to be attached to the antenna. In the latter case, the circuit can be attached to the antenna by using an ACF (Anisotropic Conductive Film).

The appropriate length of the antenna is different depending on the frequency used for reception. It is generally preferable that the antenna be as long as a wavelength divided by an integer. For example, when the frequency is 2.45 GHz, the antenna is preferably about 60 mm (half wavelength) or about 30 mm (quarter wavelength) in length.

Figure 14A:
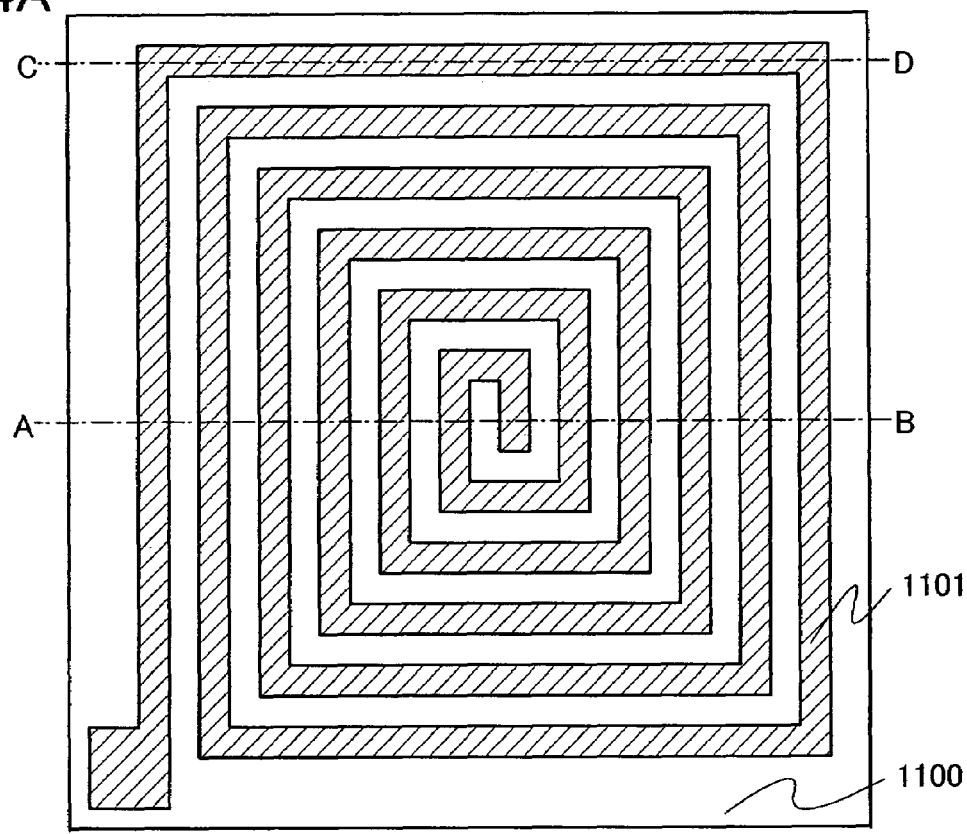
FIGS. 14A to 14C are diagrams showing an embodiment of the antenna.
Figure 14B:
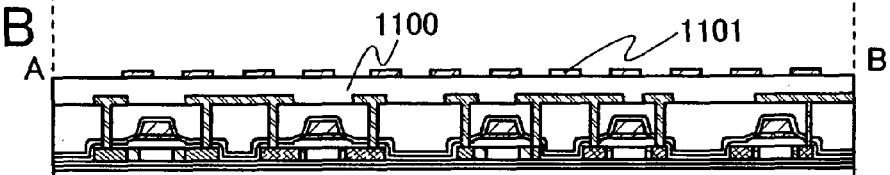
Figure 14C:
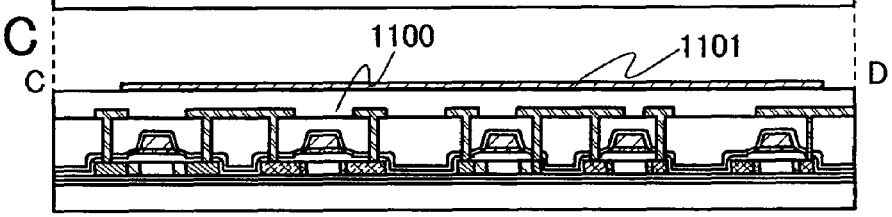

It is also possible to attach another substrate onto the nonvolatile memory circuit of the present invention and form an antenna over the substrate. FIGS. 14A to 14C show a plan view and cross-sectional views of a nonvolatile memory circuit over which a substrate 1100 is attached and a spiral antenna 1101 is provided over the substrate 1100. FIGS. 14B and 14C are cross-sectional views respectively taken along a chain line A-B and a chain line C-D of the plan view shown in FIG. 14A.

Note that the antennas shown in this embodiment are just examples and the shape of the antenna is not limited to these. The present invention can be implemented with any form of antenna.

Embodiment 5

In this embodiment, a method for manufacturing a thin film integrated circuit device including a TFT is described in detail with reference to FIGS. 15A to 17B. For simplicity, the manufacturing method is described herein by showing a cross sectional structure of a CPU (logic circuit portion) and a memory portion each using an N-channel TFT and a P-channel TFT.

Figure 15A:
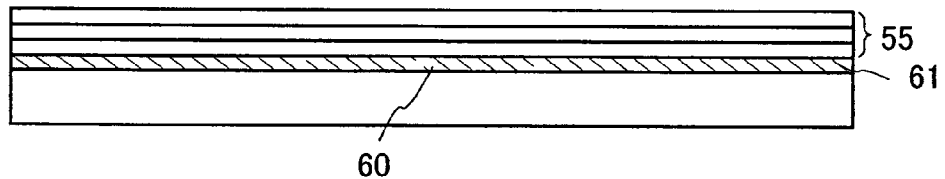
FIGS. 15A to 15E are diagrams showing a manufacturing process of a semiconductor device.

First, a peeling layer 61 is formed over a substrate 60 (FIG. 15A). The peeling layer 61 here is formed over a glass substrate (e.g., a 1737 substrate, product of Corning Incorporated) by a low-pressure CVD method using an a-Si film (amorphous silicon film) with a thickness of 50 nm. As for the substrate 60, a quartz substrate, a substrate made of an insulating material such as alumina, a silicon wafer substrate, a plastic substrate having enough heat resistance to withstand the treatment temperature in a later step, or the like may be employed as well as the glass substrate.

The peeling layer 61 is preferably formed using a film containing silicon as its main component, such as polycrystalline silicon, single crystalline silicon, or SAS (semi-amorphous silicon that is also referred to as microcrystalline silicon) as well as amorphous silicon, though the present invention is not limited to these. The peeling layer 61 may be formed by a plasma CVD method, a sputtering method, or the like as well as a low-pressure CVD method. A film doped with an impurity such as phosphorous may be employed as well. The thickness of the peeling layer 61 is desirably about 50 to 60 nm, though it may be about 30 to 50 nm in the case of employing an SAS.

Next, a protective film 55 (also referred to as a base film or a base insulating film) is formed over the peeling layer 61 (FIG. 15A). Here, the protective film 55 is constituted by three layers of a SiON (silicon oxide containing nitrogen) film with a thickness of 100 nm, a SiNO (silicon nitride containing oxygen) film with a thickness of 50 nm, and a SiON film with a thickness of 100 nm in this order from the peeling layer 61 side, though the material, the thickness, and the number of layers are not limited to these. For example, instead of the SiON film as the bottom layer, a heat resistant resin such as siloxane with a thickness of 0.5 to 3 μm may be formed by a spin coating method, a slit coating method, a droplet discharging method, or the like. Alternatively, a silicon nitride film (SiN, $Si_3N_4$, or the like) may be employed. Instead of the SiON film as the top layer, a silicon oxide film may be employed. The respective thicknesses of the layers are preferably set in the range of about 0.05 to 3 μm and can be selected within this range as required.

The silicon oxide film can be formed by thermal CVD, plasma CVD, atmospheric pressure CVD, bias ECRCVD, or the like using a mixed gas of $SiH_4$ and $O_2$, a mixed gas of TEOS (tetraethoxysilane) and $O_2$, or another mixed gas. The silicon nitride film can be formed by, for example, plasma CVD using a mixed gas of $SiH_4$ and $NH_3$. The SiON film or the SiNO film can be formed by, for example, plasma CVD using a mixed gas of $SiH_4$ and $N_2O$.

Note that when a material containing silicon as its main component, such as a-Si, is employed for the peeling layer 61 and an island-shaped semiconductor film 57, the protective film 55 that is in contact with them may be formed of $SiO_xN_y$ (x>y>0) in order to ensure the adhesiveness.

Subsequently, thin film transistors (TFTs) included in a CPU (logic circuit portion) and a memory portion of a thin film integrated circuit device are formed over the protective film 55. Note that other thin film active elements such as organic TFTs and thin film diodes may be formed as well as the TFTs.

Figure 15B:
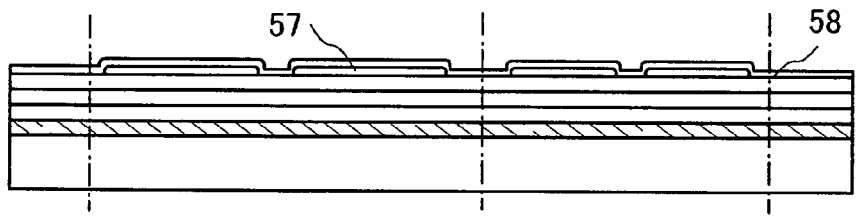

In order to manufacture a TFT, first, the island-shaped semiconductor film 57 is formed over the protective film 55 (FIG. 15B). The island-shaped semiconductor film 57 is formed of an amorphous semiconductor, a crystalline semiconductor, or a semi-amorphous semiconductor, each of which contains silicon, silicon germanium (SiGe), or the like as its main component.

In this embodiment, an amorphous silicon film with a thickness of 70 nm is formed and the surface thereof is treated with a solution containing nickel. Thermal crystallization is performed at a temperature of 500 to 750° C. so that a crystalline silicon semiconductor film is obtained, and then laser crystallization is performed to improve the crystallinity. Note that the semiconductor film may be formed by a plasma CVD method, a sputtering method, an LPCVD method, or the like. As a crystallizing method of a semiconductor film, a laser crystallization method, a thermal crystallization method, or a thermal crystallization method using a catalyst (Fe, Ru, Rh, Pd, Os, Ir, Pt, Cu, Au, or the like) may be adopted, or such methods may be performed sequentially a plurality of times.

Alternatively, in a crystallization process of an amorphous semiconductor film, a continuous wave laser may be used. In order to obtain a crystal with a large grain size through crystallization, it is preferable to use a solid state laser capable of continuous wave oscillation and apply any of second to fourth harmonics of a fundamental wave (the crystallization in this case is referred to as CWLC). For example, a second harmonic (532 nm) or a third harmonic (355 nm) of a Nd: $YVO_4$ laser (a fundamental wave: 1064 nm) may be applied. When a continuous wave laser is used, laser light emitted from a continuous wave $YVO_4$ laser of which output power is 10 W is converted into a harmonic by a non-linear optical element. There is also a method for emitting a harmonic by putting a $YVO_4$ crystal or a $GdVO_4$ crystal and a non-linear optical element in a resonator. Then, the laser light is preferably formed in a rectangular shape or an elliptical shape on an irradiated surface with an optical system to irradiate a subject. In that case, an energy density of about 0.01 to 100 $MW/cm^2$ (preferably 0.1 to 10 $MW/cm^2$) is required. Then, the semiconductor film is preferably irradiated with laser light while being moved relative to the laser light at a speed of about 10 to 2000 cm/s.

When a pulsed laser is used, a pulsed laser having a repetition rate in the range of several tens to several hundreds of Hz is generally used, though a pulsed laser having an extremely higher repetition rate of 10 MHz or more may be used as well (the crystallization in this case is referred to as MHzLC). It is said that it takes several tens to several hundreds of nanoseconds to solidify a semiconductor film completely after the semiconductor film is irradiated with pulsed laser light; thus, with the high repetition rate, pulsed laser light can be delivered before the semiconductor film melted by the previous laser light is solidified. Therefore, unlike in the case of using the conventional pulsed laser, the interface between the solid phase and the liquid phase can be moved continuously in the semiconductor film, and thus the semiconductor film having a crystal grain grown continuously along the scanning direction can be formed. Specifically, it is possible to form an aggregation of crystal grains each of which has a width of 10 to 30 μm in the scanning direction and a width of about 1 to 5 μm in the direction perpendicular to the scanning direction. By forming such crystal grains of single crystal extending long in the scanning direction, a semiconductor film having few grain boundaries at least in the channel direction of the TFT can be formed.

Note that when the protective film 55 is partially formed of siloxane that is a heat resistant organic resin, heat leak from the semiconductor film can be prevented during the aforementioned crystallization, leading to efficient crystallization.

The crystalline semiconductor film is obtained by the aforementioned method. The crystal growth directions are preferably aligned in directions of a source region, a channel formation region, and a drain region. The thickness of the crystalline layer may range from 20 to 200 nm (preferably 40 to 170 nm, and more preferably 50 to 150 nm). Subsequently, an amorphous silicon film for gettering of a metal catalyst is formed over the semiconductor film with an oxide film interposed therebetween, and the gettering is performed by heat treatment at a temperature of 500 to 750° C. Furthermore, in order to control a threshold voltage of a TFT element, boron ions are implanted into the crystalline semiconductor film at a dosage of about $10^{13}/cm^2$. Then, etching is performed with a resist used as a mask to form the island-shaped semiconductor film 57.

Alternatively, the crystalline semiconductor film may be obtained by forming a polycrystalline semiconductor film directly by an LPCVD (Low-Pressure CVD) method using a material gas of disilane ($Si_2H_6$) and germanium fluoride ($GeF_4$). The flow rate of the gas is $Si_2H_6/GeF_4$=20/0.9, the temperature for forming the film is 400 to 500° C., and He or Ar can be used as a carrier gas, though the present invention is not limited to these conditions.

It is preferable that hydrogen or halogen of $1\times10^{19}$ to $1\times10^{22}$ $cm^{-3}$, more preferably $1\times10^{19}$ to $5\times10^{20}$ $cm^{-3}$, is added to a TFT, particularly the channel region thereof. In the case of an SAS, hydrogen or halogen of $1\times10^{19}$ to $2\times10^{21}$ $cm^{-3}$ is desirably added. In either case, it is desirable that the amount of hydrogen or halogen be larger than that contained in single crystals used for an IC chip. Accordingly, local cracks that may be generated in the TFT portion can be terminated by hydrogen or halogen.

Then, a gate insulating film 58 is formed over the island-shaped semiconductor film 57 (FIG. 15B). The gate insulating film 58 is preferably formed of a single layer or stacked layers of a film containing silicon nitride, silicon oxide, silicon nitride oxide, or silicon oxynitride by a thin film forming method such as a plasma CVD method or a sputtering method. In the case of the stacked layers, a three-layer structure is preferably adopted for example, where a silicon oxide film, a silicon nitride film, and a silicon oxide film are stacked in this order from the substrate side.

Figure 15C:
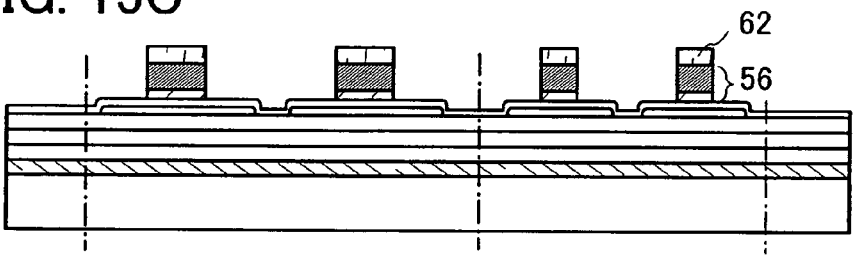
Figure 15D:
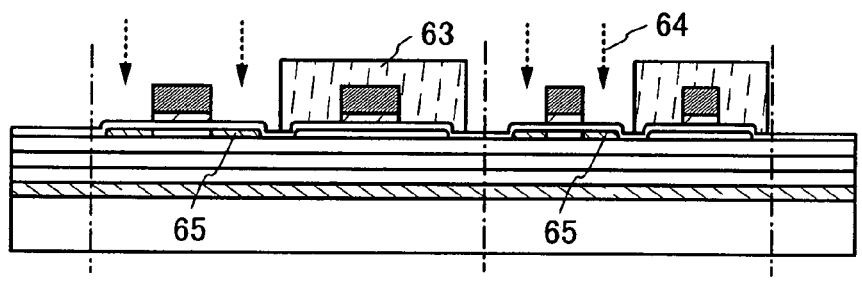
Figure 15E:
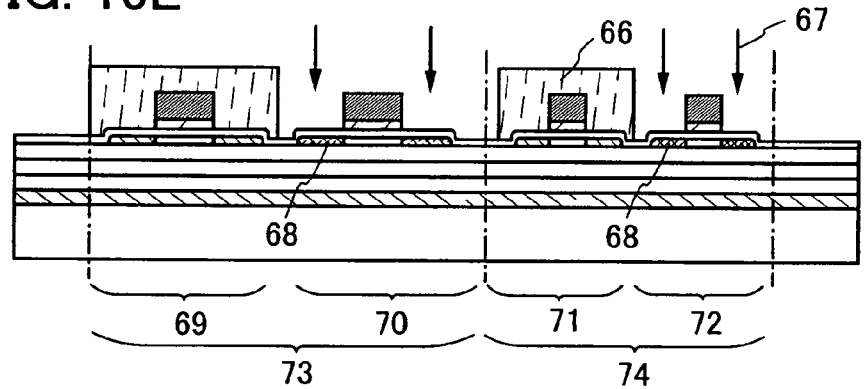

Subsequently, a gate electrode 56 is formed (FIG. 15C). In this embodiment, Si and W (tungsten) layers are stacked by a sputtering method, and etched with a resist 62 used as a mask to form the gate electrode 56. Needless to say, the material, the structure, and the manufacturing method of the gate electrode 56 are not limited to these and can be selected appropriately. For example, a stacked-layer structure of NiSi (nickel silicide) and Si doped with an impurity imparting N-type conductivity, or a stacked-layer structure of TaN (tantalum nitride) and W (tungsten) may be employed. Alternatively, the gate electrode 56 may be formed of a single layer employing any of various kinds of conductive materials.

A mask of $SiO_x$ or the like may be used instead of the resist mask. In this case, a patterning step for forming the mask of $SiO_x$, SiON, or the like (referred to as a hard mask) is additionally required; however, the mask film is less decreased in etching as compared with the resist, whereby a gate electrode with a desired width can be formed. Alternatively, the gate electrode 56 may be selectively formed by a droplet discharging method without using the resist 62.

As for the conductive material, various kinds of materials can be selected depending on the function of the conductive film. When the gate electrode 56 and the antenna are simultaneously formed, the material may be selected in consideration of their functions.

As an etching gas for etching the gate electrode 56, a mixed gas of $CF_4$, $Cl_2$, and $O_2$, or a $Cl_2$ gas is employed here, though the present invention is not limited to this.

Subsequently, a resist 63 is formed so as to cover portions to be P-channel TFTs 70 and 72. An impurity element 64 imparting N-type conductivity (for example, P (phosphorous) or As (arsenic)) is added to the island-shaped semiconductor films of N-channel TFTs 69 and 71 at a low concentration with the gate electrode used as a mask (a first doping step, FIG. 15D). The first doping step is performed under such conditions as a dosage of $1\times10^{13}$ to $6\times10^{13}/cm^2$ and an acceleration voltage of 50 to 70 kV, though the present invention is not limited to these conditions. In the first doping step, doping is performed through the gate insulating film 58 to form pairs of low concentration impurity regions 65. Note that the first doping step may be performed to the entire surface without covering the P-channel TFT regions with the resist.

After the resist 63 is removed by ashing or the like, another resist 66 is formed so as to cover the N-channel TFT regions. An impurity element 67 imparting P-type conductivity (for example, B (boron)) is added to the island-shaped semiconductor films of the P-channel TFTs 70 and 72 at a high concentration with the gate electrode used as a mask (a second doping step, FIG. 15E). The second doping step is performed under such conditions as a dosage of $1\times10^{16}$ to $3\times10^{16}/cm^2$ and an acceleration voltage of 20 to 40 kV. In the second doping step, the impurity element 67 imparting P-type conductivity is added through the gate insulating film 58 to form a pair of P-type high concentration impurity regions 68.

Figure 16A:
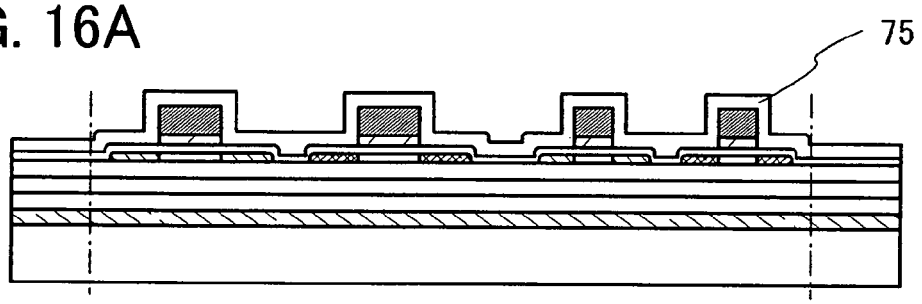
FIGS. 16A to 16D are diagrams showing a manufacturing process of a semiconductor device.
Figure 16B:
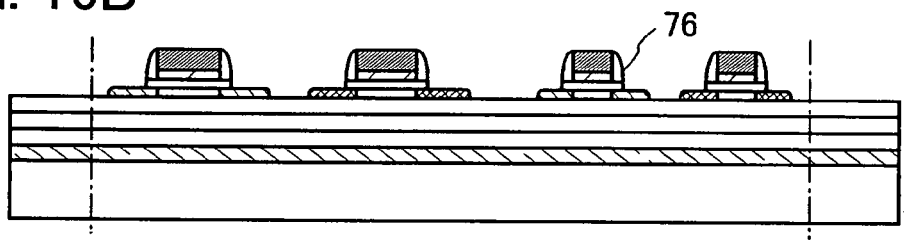
Figure 16C:
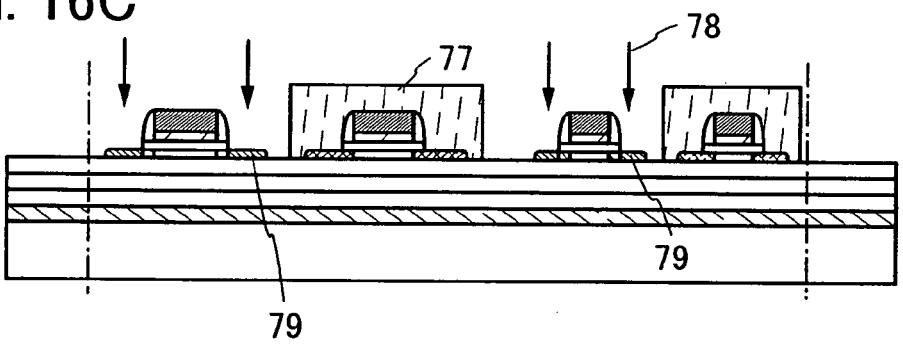

After the resist 66 is removed by ashing or the like, an insulating film 75 is formed over the surface of the substrate (FIG. 16A). In this embodiment, a $SiO_2$ film with a thickness of 100 nm is formed by a plasma CVD method. After that, the insulating film 75 and the gate insulating film 58 are removed by an etch back method to form a sidewall 76 in a self-aligned manner (FIG. 16B). As an etching gas, a mixed gas of $CHF_3$ and He is employed. Note that the step of forming the sidewall is not limited to this.

Figure 17A:
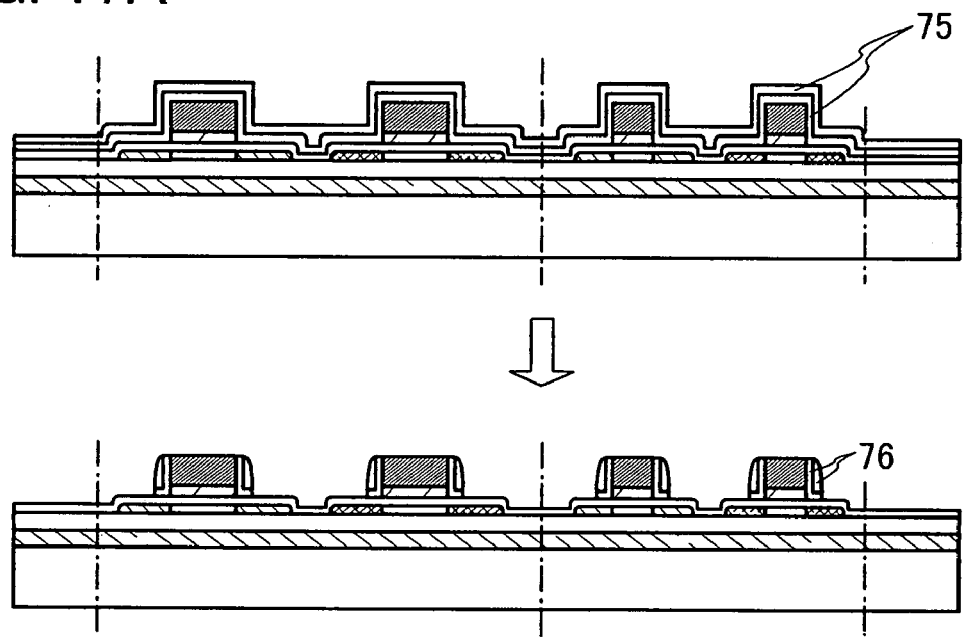
FIGS. 17A and 17B are diagrams showing a manufacturing process of a semiconductor device.

The forming method of the sidewall 76 is not limited to the aforementioned one. For example, methods shown in FIGS. 17A and 17B may be employed as well. FIG. 17A shows the insulating film 75 having a structure in which two or more layers are stacked. The insulating film 75 has, for example, a two-layer structure of a SiON (silicon oxynitride) film with a thickness of 100 nm and an LTO (Low Temperature Oxide) film with a thickness of 200 nm. In this embodiment, the SiON film is formed by a plasma CVD method, and the LTO film is obtained by forming a $SiO_2$ film by a low pressure CVD method. Then, etch back is performed to form the sidewalls 76 having an L shape and an arc shape.

Figure 17B:
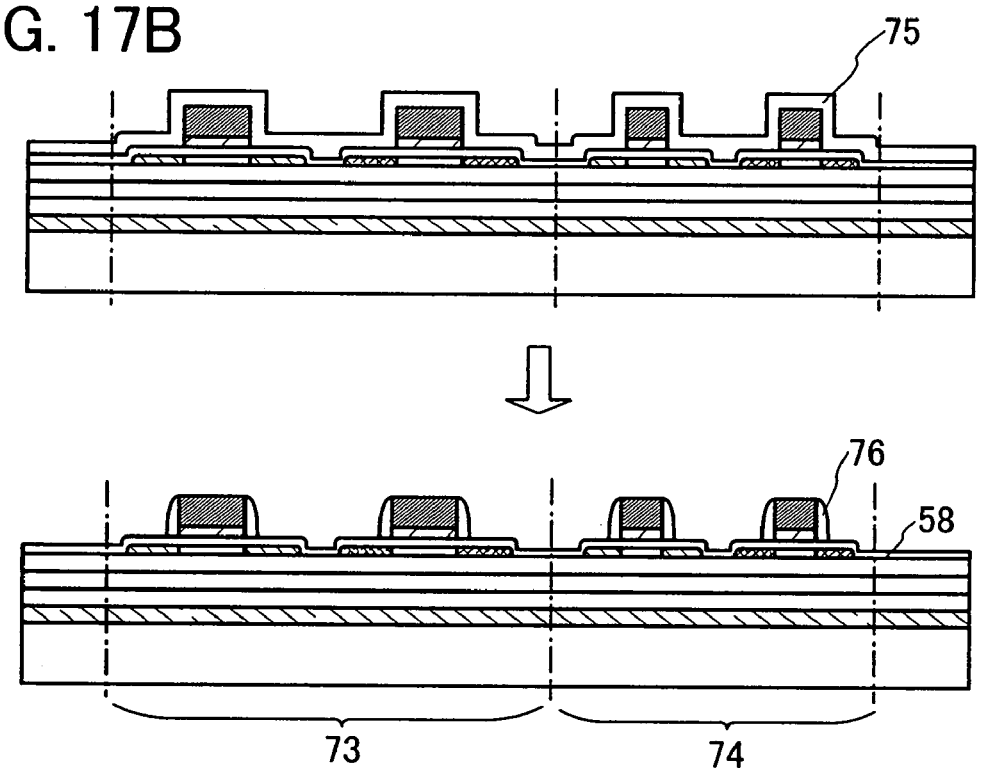

FIG. 17B shows the example where the etching is performed so that the gate insulating film 58 is left after the etch back. The insulating film 75 in this case may have a single-layer structure or a stacked-layer structure.

The sidewall 76 serves as a mask when an impurity imparting N-type conductivity is added at a high concentration in a later step to form a low concentration impurity region or a non-doped offset region under the sidewall 76. In any of the aforementioned methods of forming the sidewall, the conditions of the etch back may be appropriately changed depending on the width of the low concentration impurity region or the offset region to be formed.

Subsequently, another resist 77 is formed so as to cover the P-channel TFT regions. An impurity element 78 imparting N-type conductivity (for example, P (phosphorus) or As (arsenic)) is added at a high concentration with the gate electrode 56 and the sidewall 76 used as masks (a third doping step, FIG. 16C). The third doping step is performed under such conditions as a dosage of $1\times10^{13}$ to $5\times10^{15}/cm^2$ and an acceleration voltage of 60 to 100 kV. In the third doping step, the impurity element 78 imparting N-type conductivity is added to form a pair of N-type high concentration impurity regions 79.

After the resist 77 is removed by ashing or the like, thermal activation of the impurity regions may be performed. For example, a SiON film with a thickness of 50 nm may be formed, and then heat treatment may be performed at a temperature of 550° C. for four hours in a nitrogen atmosphere. Alternatively, it is also possible that a $SiN_x$ film containing hydrogen is formed to have a thickness of 100 nm and heat treatment is performed at a temperature of 410° C. for one hour in a nitrogen atmosphere. Accordingly, defects in the crystalline semiconductor film can be improved. This step allows, for example, termination of a dangling bond in the crystalline silicon and is called a hydrogenation step or the like. Then, a SiON film with a thickness of 600 nm is formed as a cap insulating film for protecting the TFT. Note that the aforementioned hydrogenation step may be performed after the formation of this SiON film. In that case, the $SiN_x$ film and the SiON film thereon can be continuously formed. In this manner, the insulating film includes three layers of SiON, $SiN_x$, and SiON that are formed in this order from the substrate side over the TFT, though the structure and the material are not limited to these. Note that such an insulating film is preferably formed, since it also has a function to protect the TFT.

Figure 16D:
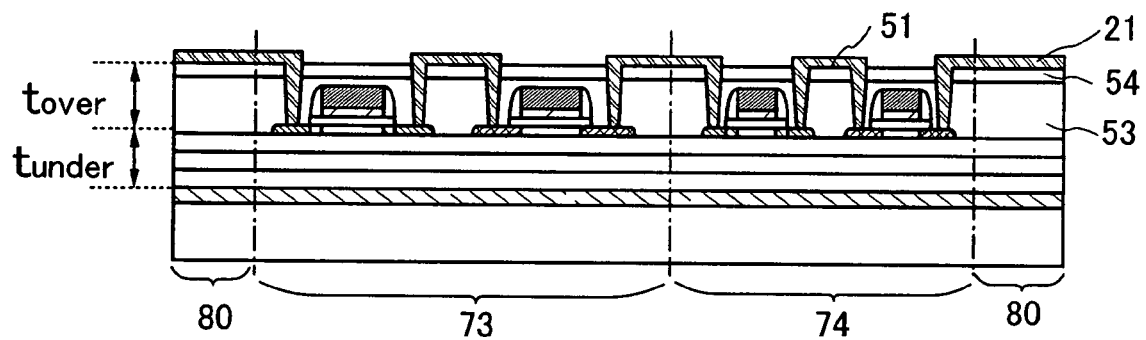

Subsequently, an interlayer film 53 is formed over the TFTs (FIG. 16D). For the interlayer film 53, a heat resistant organic resin such as polyimide, acrylic, polyamide, or siloxane may be employed. The interlayer film 53 can be formed by spin coating, dipping, spray coating, droplet discharging (inkjet printing, screen printing, offset printing, or the like), a doctor knife, a roll coater, a curtain coater, a knife coater, or the like depending on the material thereof. Alternatively, the interlayer film 53 can be formed of an inorganic material such as silicon oxide, silicon nitride, silicon oxynitride, PSG (phosphosilicate glass), BPSG (boron phosphosilicate glass), alumina, or the like. These insulating films may be stacked to form the interlayer film 53 as well.

A protective film 54 may be formed over the interlayer film 53. As the protective film 54, a film containing carbon such as DLC (Diamond-Like Carbon) or carbon nitride (CN), a silicon oxide film, a silicon nitride film, a silicon nitride oxide film, or the like may be employed. The protective film 54 can be formed by a plasma CVD method, atmospheric pressure plasma, or the like. Alternatively, a photosensitive or nonphotosensitive organic material such as polyimide, acrylic, polyamide, resist, or benzocyclobutene, or a heat resistant organic resin such as siloxane may be employed.

A filler may be mixed into the interlayer film 53 or the protective film 54 in order to prevent these films from being detached or cracked due to stress generated by a difference of thermal expansion coefficient between the interlayer film 53 or the protective film 54 and a conductive material or the like of a wiring that is formed later.

Subsequently, after forming a resist over the interlayer film 53, etching is performed to form contact holes, so that a wiring 51 for connecting the TFTs to each other and a connecting wiring 21 to be connected to an external antenna are formed (FIG. 16D). In the above step, the contact holes in a memory portion 74 are formed by the second light-exposing means which uses the laser irradiation apparatus shown in any of Embodiment Modes 1 to 3. As an etching gas for forming the contact holes, a mixed gas of $CHF_3$ and He is employed, though the present invention is not limited to this. The wiring 51 and the connecting wiring 21 may be simultaneously formed using the same material, or may be formed separately. In this embodiment, the wiring 51 connected to the TFTs has a five-layer structure in which Ti, TiN, Al—Si, Ti, and TiN layers are formed in this order by a sputtering method and then they are etched.

By mixing Si into the Al layer, hillock can be prevented from generating in the resist baking when the wiring is formed. Instead of Si, Cu of about 0.5% may be mixed. When the Al—Si layer is interposed between the Ti and TiN layers, hillock resistance can be further improved. When the wiring is formed, the aforementioned hard mask made of SiON or the like is preferably employed. Note that the material and the forming method of the wiring are not limited to these, and the aforementioned material for forming the gate electrode 56 may be employed as well.

In this embodiment, only the TFT regions for forming a CPU 73, the memory portion 74, and the like and a terminal portion 80 to be connected to an antenna are formed over one substrate. This embodiment, however, can also be applied to the case where the TFT regions and the antenna are formed over one substrate. In the latter case, it is preferable that the antenna be formed over the interlayer film 53 or the protective film 54, and then covered with another protective film. As a conductive material of the antenna, Ag, Au, Al, Cu, Zn, Sn, Ni, Cr, Fe, Co, Ti, or an alloy containing any of them may be employed, though the present invention is not limited to these. The wiring and the antenna may be formed of different materials from each other. It is desirable that the wiring and the antenna be formed of a metal material having high malleability and ductility, and more preferably, the respective thicknesses thereof be increased so as to withstand the stress due to deformation.

As for the forming method of the antenna, the antenna may be formed over the entire surface by a sputtering method and etched with a resist mask, or may be selectively formed by using a nozzle by a droplet discharging method. The droplet discharging method here described includes an offset printing method, screen printing, or the like as well as an inkjet printing method. The wiring and the antenna may be formed simultaneously, or may be formed separately such that one of them is formed first, and then the other is formed thereon.

Through the aforementioned steps, a thin film integrated circuit device including TFTs is completed. Although a top gate structure is employed in this embodiment, a bottom gate structure (an inversely staggered structure) may be employed as well. A region where a thin film active element such as a TFT is not formed mainly includes a base insulating film material, an interlayer insulating film material, and a wiring material. This region preferably occupies 50% or more, and more preferably about 70 to 95% of the whole thin film integrated circuit device. As a result, the ID chip can be easily bent, whereby its completed product such as an ID label can be easily handled. In such a case, it is preferable that an island-shaped semiconductor region (island) of the active element including the TFT portion occupy 1 to 30%, and more preferably 5 to 15% of the whole thin film integrated circuit device.

As shown in FIG. 16D, each thickness of the upper and lower protective films or the interlayer film in the thin film integrated circuit device is preferably controlled so that the distance ($t_{under}$) between the semiconductor layer of the TFT and the lower protective film may be the same or substantially the same as the distance ($t_{over}$) between the semiconductor layer and the interlayer film over the semiconductor layer (or protective film if formed). By disposing the semiconductor layer in the middle of the thin film integrated circuit device in this manner, stress applied to the semiconductor layer can be relaxed, whereby generation of cracks can be prevented.

In this embodiment, the memory portion is manufactured by using the laser irradiation apparatus shown in any of Embodiment Modes 1 to 3. Therefore, a laser irradiation pattern can be changed at high speed and thus, laser irradiation can be effectively carried out in a manufacturing process of a device for which a random irradiation pattern needs to be formed, such as a ROM. Accordingly, mass-productivity in manufacturing and the like of ROMs for ID chips can be easily improved.

Embodiment 6

The semiconductor device manufactured by utilizing the present invention can be applied to an IC card, an IC tag, an RFID tag, a transponder, a bill, securities, a passport, an electronic appliance, a bag, and a garment. In this embodiment, examples of an IC card, an ID tag, an ID chip, and the like are described with reference to FIGS. 18A to 18H.

Figure 18A:
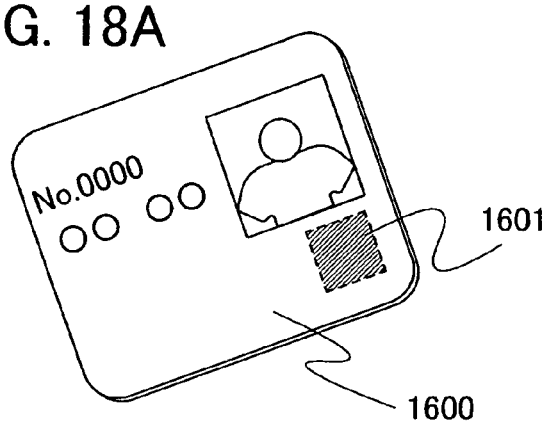
FIGS. 18A to 18H are diagrams showing applications of a semiconductor device manufactured by the invention.

FIG. 18A shows an IC card that can be used for personal identification as well as for a credit card or electronic money that allows cashless payment by utilizing a rewritable memory circuit incorporated in the IC card. A memory circuit 1601 using the present invention is incorporated in an IC card 1600.

Figure 18B:
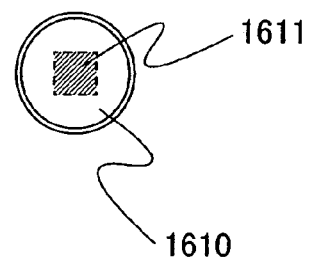

FIG. 18B shows an ID tag that can be used for personal identification as well as for access control to a specific area, and the like since it can be miniaturized. A memory circuit 1611 using the present invention is incorporated in an ID tag 1610.

Figure 18C:
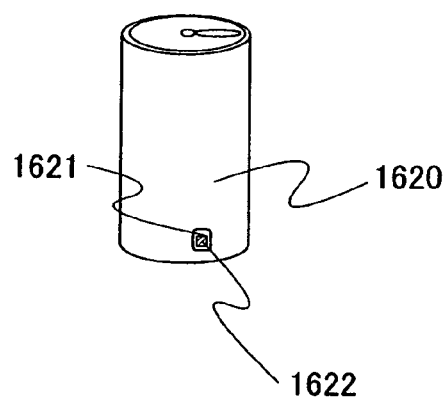

FIG. 18C shows a product 1620 with an ID chip 1622 attached. The ID chip 1622 is used for product management in retail stores such as supermarkets. The present invention is applied to a memory circuit in the ID chip 1622. By attaching the ID chip 1622 to the product 1620 in this manner, stock management can be facilitated and shoplifting and the like can be prevented. Although a protective film 1621 that also functions as an adhesive is used to prevent the ID chip 1622 from falling off in the drawing, the ID chip 1622 may be attached directly to the product 1620 with an adhesive. Further, the ID chip 1622 is preferably formed by using the flexible substrate described in Embodiment 2 so as to be easily attached to the product 1620.

Figure 18D:
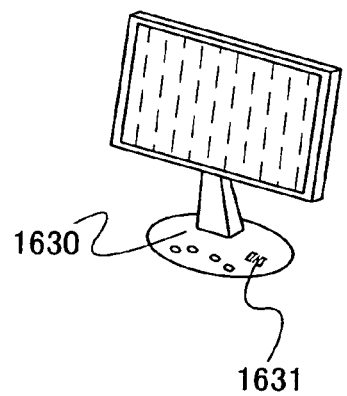

FIG. 18D shows an ID chip for identification that is incorporated in a product in the manufacturing thereof. In the drawing, an ID chip 1631 is incorporated in a housing 1630 of a display as an example. The present invention is applied to a memory circuit in the ID chip 1631. Such a structure facilitates manufacturer's identification of products, distribution management of products, or the like. Although the housing of a display is shown as an example in the drawing, the present invention is not limited to this and can be applied to various electronic appliances and objects.

Figure 18E:
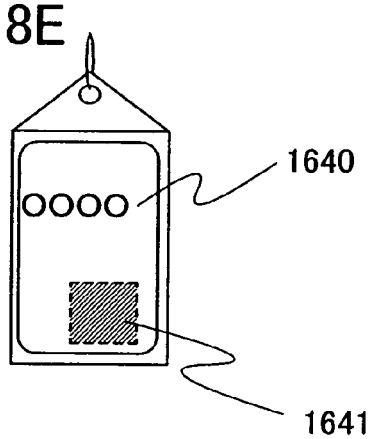

FIG. 18E shows a shipping tag used for object transportation. In the drawing, an ID chip 1641 is incorporated in a shipping tag 1640. The present invention is applied to a memory circuit in the ID chip 1641. Such a structure facilitates selection of delivery destination, distribution management of products, and the like. Although the shipping tag is to be attached to an object with a string in the drawing, the present invention is not limited to this. Alternatively, the shipping tag may be directly attached to an object with a sealing member or the like.

Figure 18F:
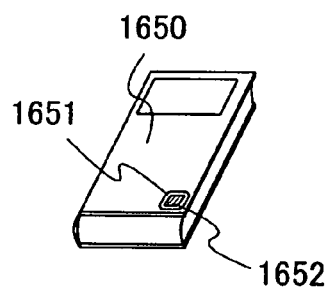

FIG. 18F shows an ID chip 1652 incorporated in a book 1650. The present invention is applied to a memory circuit in the ID chip 1652. Such a structure facilitates distribution management in book stores, a lending process in libraries and the like, and so on. Although a protective film 1651 that also functions as an adhesive is used to prevent the ID chip 1652 from falling off in the drawing, the ID chip 1652 may be attached directly to the book 1650 with an adhesive or embedded in the cover of the book 1650.

Figure 18G:
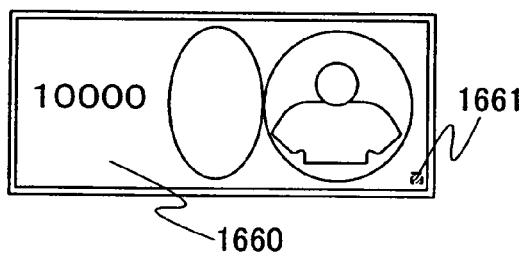

FIG. 18G shows an ID chip 1661 incorporated in a bill 1660. The present invention is applied to a memory circuit in the ID chip 1661. Such a structure easily prevents distribution of counterfeit bills. In view of the nature of bills, it is more preferable that the ID chip 1661 be embedded in the bill 1660 so as not to fall off. The present invention can be applied to other paper products such as securities and a passport as well as a bill.

Figure 18H:
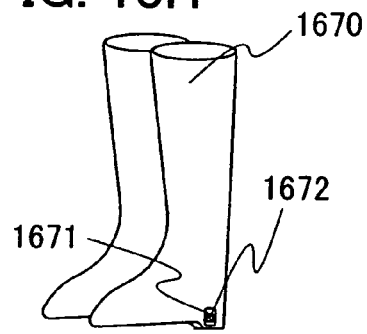

FIG. 18H shows an ID chip 1672 incorporated in a shoe 1670. The present invention is applied to a memory circuit in the ID chip 1672. Such a structure facilitates manufacturer's identification, distribution management of products, or the like. Although a protective film 1671 that also functions as an adhesive is used to prevent the ID chip 1672 from falling off in the drawing, the ID chip 1672 may be attached directly to the shoe 1670 with an adhesive, or embedded in the shoe 1670. The present invention can be applied to other wearable articles such as a bag and a garment as well as shoes.

Described hereinafter is the case where an ID chip is attached to various objects in order to protect the security thereof, such as anti-theft security and anti-counterfeit security.

Figure 19:
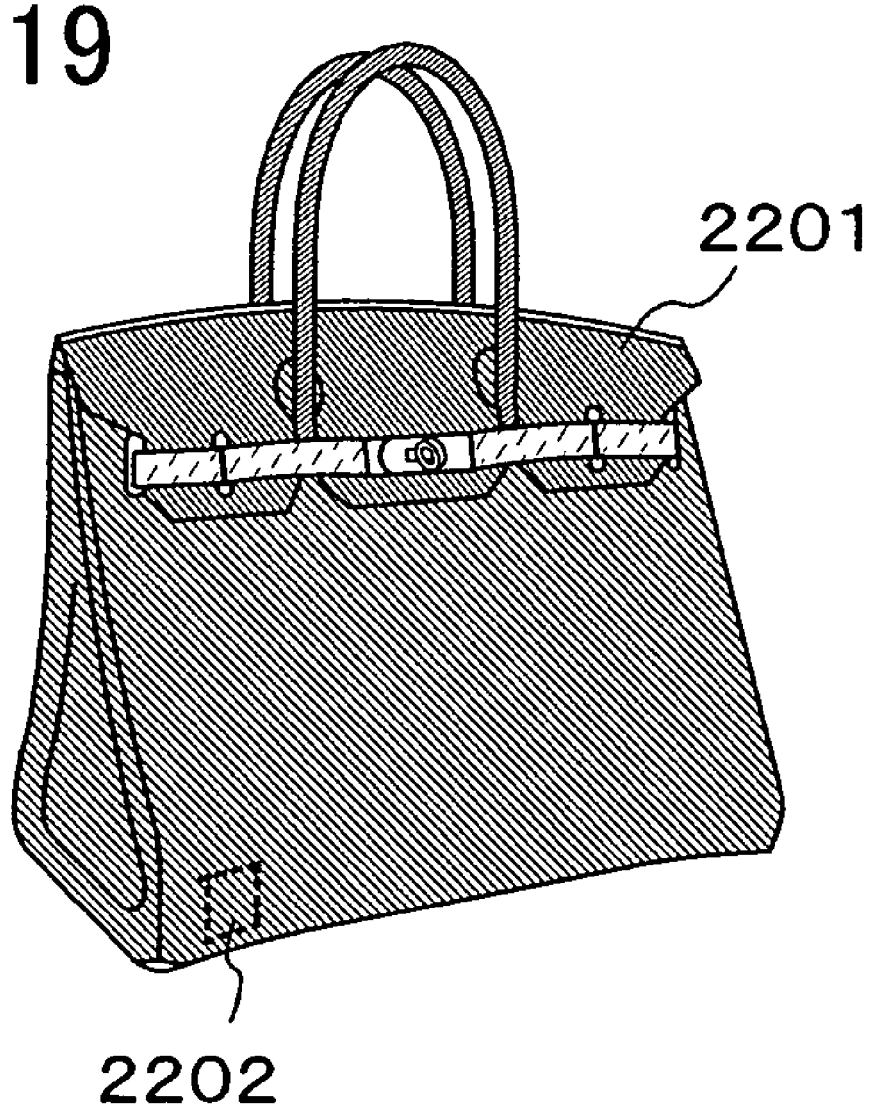
FIG. 19 is a diagram showing a bag using a semiconductor device manufactured by the invention.

For example, as an example of using an ID chip for anti-theft security, a case is described in which an ID chip is attached to a bag. The present invention is applied to a memory circuit in an ID chip 2202. As shown in FIG. 19, the ID chip 2202 is attached to a bag 2201. The ID chip 2202 can be attached to a part of the bottom, a side surface, or the like of the bag 2201, for example. Being extremely thin and small, the ID chip 2202 can be attached to the bag 2201 while maintaining an attractive design thereof. In addition, since the ID chip 2202 transmits light, a thief cannot easily judge whether the ID chip 2202 is attached. Accordingly, there is little fear that the ID chip 2202 may be removed by the thief.

If the bag 2201 with the ID chip 2202 attached is stolen, data on the actual position of the bag 2201 can be obtained by using, for example, GPS (Global Positioning System). Note that the GPS is a system for determining the position with each time difference between the time a signal is transmitted by a GPS satellite and the time the signal is received.

Besides the stolen products, the actual position of the bag 2201 lost or left behind can be determined by the GPS.

Besides the bag 2201, the ID chip can be attached to a vehicle such as a car or a bicycle, a watch, and accessories.

Described next is the case where an ID chip is attached to a passport, a driving license, and the like for the purpose of counterfeit prevention.

Figure 20A:
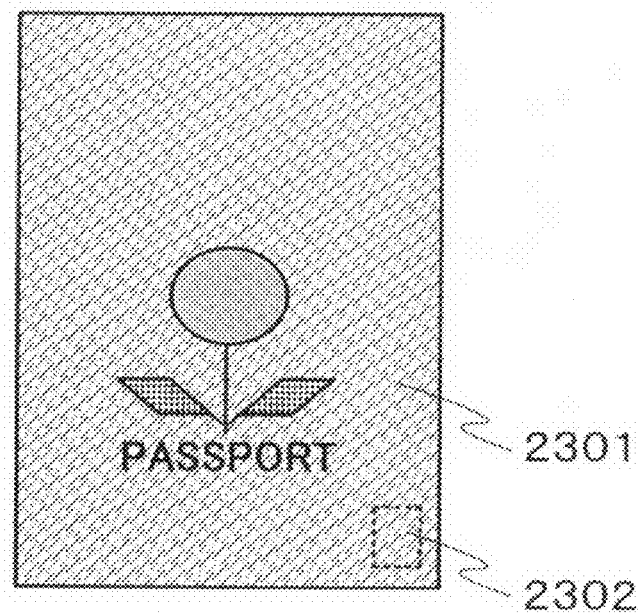
FIGS. 20A and 20B are diagrams showing certificates each using a semiconductor device manufactured by the invention.

FIG. 20A shows a passport 2301 with an ID chip attached. Although an ID chip 2302 is incorporated in the cover of the passport 2301 in FIG. 20A, it may be attached to other pages. As the ID chip 2302 transmits light, it may also be attached to the surface of the cover. Further, the ID chip 2302 may be sandwiched between materials of the cover or the like to be incorporated inside the cover.

Figure 20B:
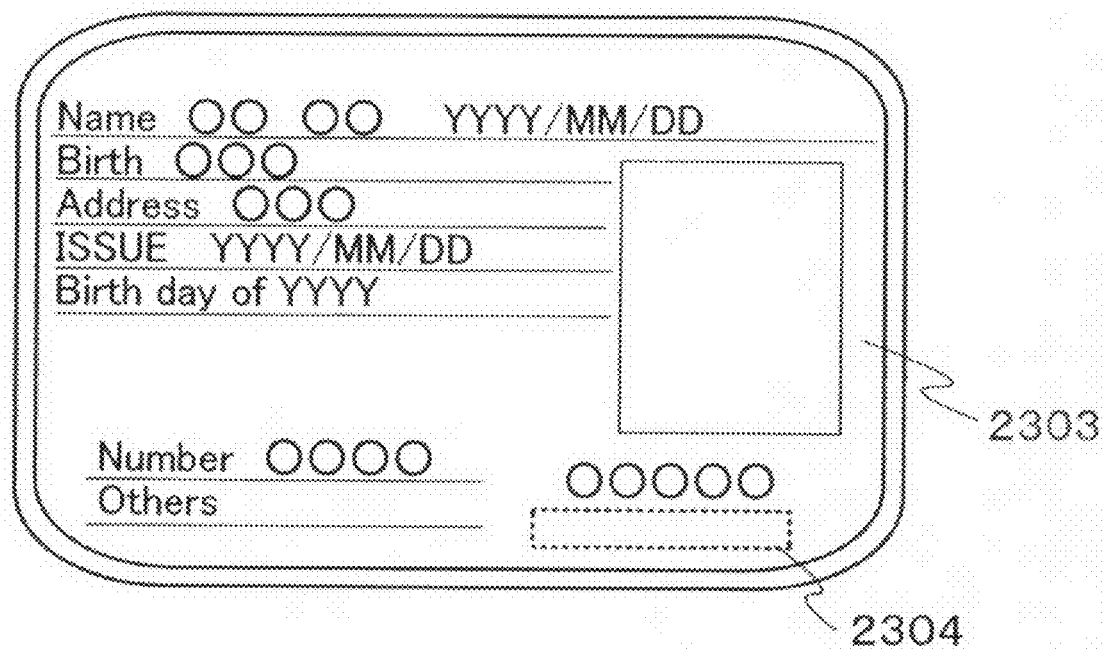

FIG. 20B shows a driving license 2303 with an ID chip attached. In FIG. 20B, an ID chip 2304 is incorporated in the driving license 2303. Since the ID chip 2304 transmits light, it may be provided on a printed surface of the driving license 2303. For example, the ID chip 2304 is attached to a printed surface of the driving license 2303, a set of thermosetting resin films are provided so as to sandwich the driving license 2303, and the films are fixed by applying pressure and heat thereto; thus, the driving license 2303 incorporating the ID chip 2304 can be covered. Alternatively, the ID chip 2304 may be sandwiched between materials of the driving license 2303 and incorporated inside.

When the ID chip is attached to the aforementioned objects, counterfeiting thereof can be prevented. In addition, design of the passport, the driving license, and the like can be maintained since an extremely thin and small ID chip is used. Further, since the ID chip transmits light, it may be attached to the surface of the object.

The attachment of the ID chip also facilitates the management of the passport, the driving license, and the like. In addition, data can be stored in the ID chip without being written directly to the passport, the driving license, and the like, resulting in privacy protection.

Figure 21:
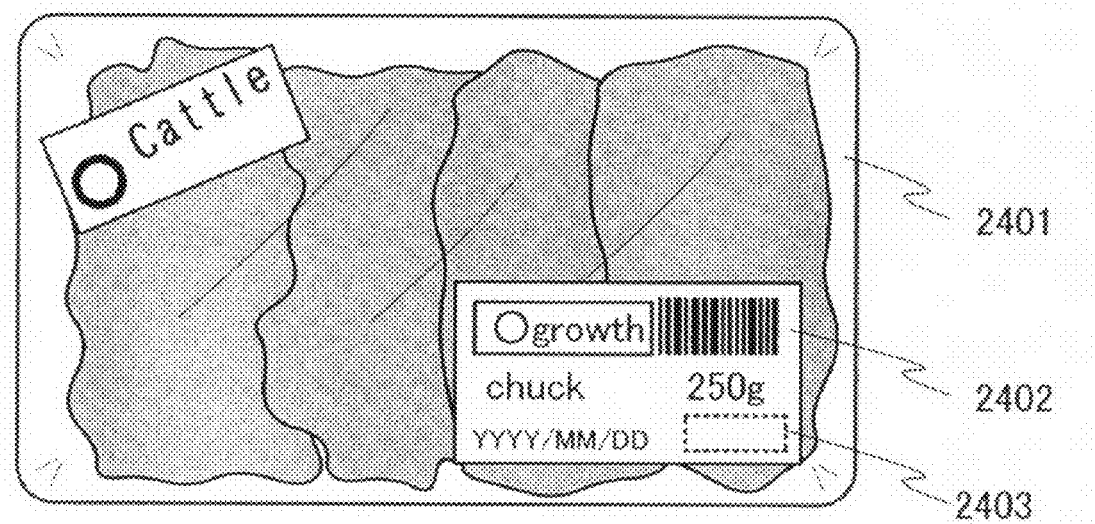
FIG. 21 is a diagram showing food management using a semiconductor device manufactured by the invention.

An ID chip that is attached to a product such as food for safety control is shown in FIG. 21.

FIG. 21 shows a label 2402 incorporating an ID chip 2403, which is attached to a package of meat 2401. The ID chip 2403 may be attached to the surface of the label 2402 or incorporated in the label 2402. The ID chip may also be attached to cellophane for wrapping fresh food such as vegetables.

The ID chip 2403 can store basic data on the product, such as a production area, a producer, a processing date, and a use-by date. Such basic data which is not required to be rewritten is preferably stored in a non-rewritable memory such as an MROM. Moreover, additional data such as a recipe using the product can be stored in the ID chip 2403. Such additional data may be stored in a rewritable and erasable memory such as an EEPROM.

For safety control of food, it is important to obtain data on conditions of plants and animals before processing. In order to do this, an ID chip may be implanted in plants and animals and data thereon may be obtained by a reader device. The data on plants and animals includes a breeding area, a feed, a breeder, presence or absence of infection, and the like.

When the price of a product is stored in the ID chip, payment of the product can be made more simply in a shorter time than in the case of using a conventional bar code. That is, a plurality of products each having the ID chip attached can be settled at a time. In the case of reading a plurality of ID chips at a time, a reader device is required to be equipped with an anti-collision function.

Further, depending on communication distance of the ID chip, payment of the products can be made at the cash register even when there is a distance between the products and the cash register, and shoplifting and the like can also be prevented by the ID chip.

The ID chip can be used in combination with other information media such as a bar code and a magnetic tape. For example, basic data that is not required to be rewritten may be stored in the ID chip whereas data that is to be rewritten such as discount price and bargain information may be stored in the bar code. The data of the bar code can be easily modified unlike that of the ID chip.

As set forth above, the attachment of the ID chip to the products can increase the amount of information given to consumers.

Figure 22A:
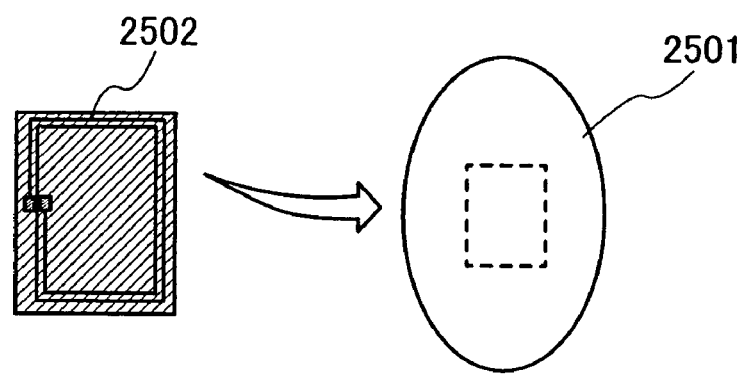
FIGS. 22A and 22B are diagrams showing logistics using a semiconductor device manufactured by the invention.
Figure 22B:
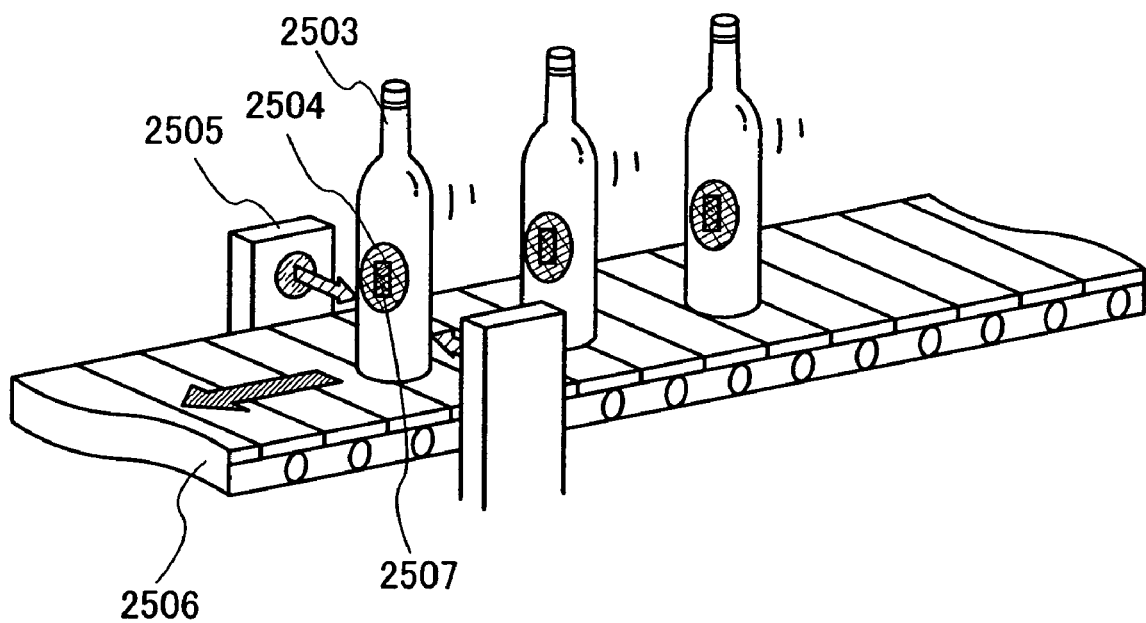

Described next is the case of attaching an ID chip to a product such as a beer bottle for distribution management, with reference to FIGS. 22A and 22B. As shown in FIG. 22A, an ID chip 2502 can be attached to a beer bottle using, for example, a label 2501.

The ID chip 2502 stores basic data such as a manufacturing date, a manufacturing area, and ingredients of beer. Such basic data is not required to be rewritten; thus, it may be stored in a non-rewritable memory such as a mask ROM. The ID chip also stores individual data of each beer bottle such as a delivery address and a delivery date. For example, as shown in FIG. 22B, when each beer bottle 2503 moving on a conveyor belt 2506 passes a writer device 2505, each delivery address and delivery date can be stored in an ID chip 2507 incorporated in a label 2504. Such individual data is preferably stored in a rewritable and erasable memory such as an EEPROM.

A system is preferably configured such that when data on a purchased product is transmitted from a delivery destination to a distribution management center via a network, the delivery address and date are calculated by a writer device, a personal computer for controlling the writer device, or the like, and then stored in the ID chip.

Since the beer bottles are usually delivered per case, the ID chip may be attached to each case or every several cases to store individual data.

When the ID chip is attached to such drinks that may store a plurality of delivery addresses, the time required for manual data input can be reduced, resulting in reduced input error. In addition, it is possible to lower labor costs that are the most expensive in the distribution management field. Thus, the attachment of the ID chip allows the distribution management to be performed with few errors and at low cost.

Additional data such as food to go with beer and a recipe using beer may be stored at the delivery destination. As a result, the food and the like can be promoted and consumers' willingness to buy can be increased. Such additional data is preferably stored in a rewritable and erasable memory such as an EEPROM. In this manner, the attachment of the ID chip increases the amount of information given to consumers; thus, they can purchase products at ease.

A product with an ID chip attached for manufacturing management is described as well as a manufacturing apparatus (manufacturing robot) controlled based on data of the ID chip.

Customized products can be manufactured in such a way that an ID chip is attached to the product on a production line, and the product is manufactured based on data on the customized product stored in the ID chip. For example, in a production line of cars that can provide free choice of color for doors, an ID chip is attached to a part of each car and a painting apparatus is controlled based on the data of the ID chip.

When the ID chip is attached to a part of the car as above, there is no need to control in advance the order and the number of cars having the same color to be put into a production line. Therefore, it is not necessary to set a program for controlling a painting apparatus in accordance with the order and number of cars. That is, the manufacturing apparatus can operate individually based on data of the ID chip attached to each car.

As set forth above, the ID chip can be applied to various fields. Based on the data stored in the ID chip, individual manufacturing data can be obtained and the manufacturing apparatus can be controlled based on the individual data.

Figure 23:
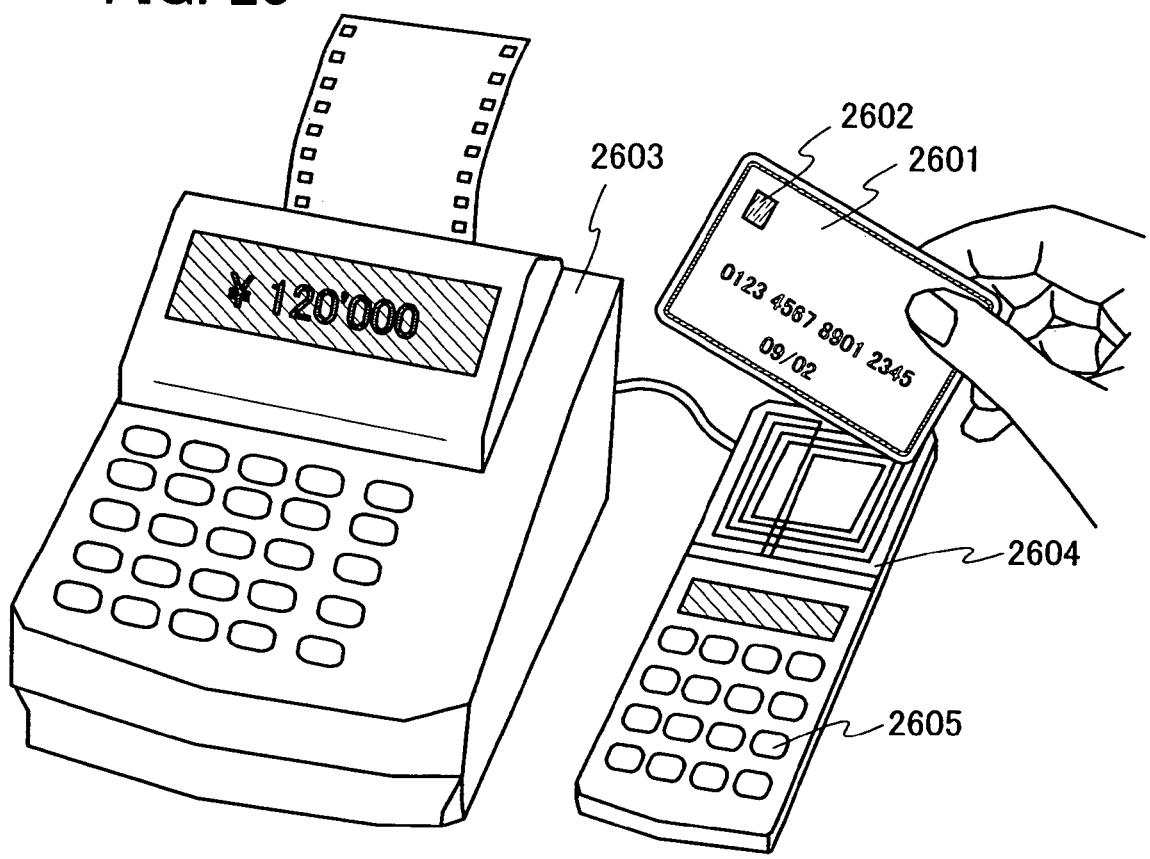
FIG. 23 is a diagram showing IC card settlement using a semiconductor device manufactured by the invention.

Described next is an IC card using the ID chip of the present invention, which is utilized as electronic money. FIG. 23 shows an IC card 2601 that is used to make payment. The IC card 2601 has an ID chip 2602 of the present invention. A register 2603 and a reader/writer 2604 are used for using the IC card 2601. The ID chip 2602 stores data on the amount of money available on the IC card 2601, and the data on the amount can be read without contact by the reader/writer 2604 and transmitted to the register 2603. The register 2603 verifies that the amount available on the IC card 2601 exceeds the payment amount, and then payment is made. Subsequently, data on remainder of the amount of money after the payment is transmitted to the reader/writer 2604, and written to the ID chip 2602 of the IC card 2601 by the reader/writer 2604.

The reader/writer 2604 may be equipped with a key 2605 for inputting a password and the like, whereby the IC card 2601 can be prevented from being used by a third party without notice.

The applications shown in this embodiment are just examples, and the present invention is not limited to these.

As set forth above, the application range of the present invention is so wide that the ID chip of the present invention can be applied for identification of all products.

The present invention provides a laser irradiation apparatus and a method of laser irradiation, by which any pattern can be written by simultaneously irradiating an irradiated body with a plurality of laser beams. The present invention can be applied to not only a manufacturing process of a ROM as above but also a light-exposure step in a semiconductor process. Moreover, the present invention can be applied to a desired process by irradiating an irradiated body with a laser beam (for example, letter carving).

This application is based on Japanese Patent Application serial no. 2006-044201 filed in Japan Patent Office on Feb. 21 in 2006, the entire contents of which are hereby incorporated by reference.

What is claimed is:

1. A method for manufacturing a semiconductor device, comprising:
    forming a plurality of island shape semiconductor layers each electrically connected to a source electrode and a drain electrode over a substrate,
    forming a first interlayer insulating film over the plurality of island shape semiconductor layers;
    forming a plurality of gate electrodes over each of the plurality of island shape semiconductor layers with the first interlayer insulating film interposed therebetween;
    forming a second interlayer insulating film over the plurality of gate electrodes;
    providing a resist over the second interlayer insulating film;
    deflecting each of a plurality of laser beams divided by a diffractive optical element, by each of a plurality of micromirrors;
    irradiating the resist with each of the plurality of laser beams;
    developing the resist; and
    etching the first interlayer insulating film and the second interlayer insulating film to form a contact hole selectively,
    wherein each of the plurality of laser beams is converged in a central portion of each of the plurality of micromirrors.

2. The method for manufacturing a semiconductor device according to claim 1 wherein,
    a spot size of each of the plurality of laser beams on each of the plurality of micromirrors is smaller than a size of a surface area of each of the plurality of micromirrors.

3. A method for manufacturing a semiconductor device, comprising:
    forming a plurality of island shape semiconductor layers each electrically connected to a source electrode and a drain electrode over a substrate,
    forming a first interlayer insulating film over the plurality of island shape semiconductor layers;
    forming a plurality of gate electrodes over each of the plurality of island shape semiconductor layers with the first interlayer insulating film interposed therebetween;
    forming a second interlayer insulating film over the plurality of gate electrodes;
    providing a resist over the second interlayer insulating film;
    deflecting each of a plurality of laser beams divided by a diffractive optical element, by each of a plurality of micromirrors;
    irradiating the resist with each of the plurality of laser beams;
    developing the resist; and
    etching the first interlayer insulating film and the second interlayer insulating film to form a contact hole selectively,
    wherein each of the plurality of laser beams is converged between a central portion and a corner portion of each of the plurality of micromirrors.

4. The method for manufacturing a semiconductor device according to claim 3 wherein,
    a spot size of each of the plurality of laser beams on each of the plurality of micromirrors is smaller than a size of a surface area of each of the plurality of micromirrors.

5. A method for manufacturing a semiconductor device, comprising:
    forming a first interlayer insulating film over a substrate,
    forming a second interlayer insulating film over the first interlayer insulating film;
    forming a resist on the second interlayer insulating film;
    dividing a laser beam into a plurality of first laser beams by a diffractive optical element;
    deflecting each of the plurality of first laser beams by each of a plurality of micromirrors to form a plurality of second laser beams, wherein each of the plurality of first laser beams is converged in a central portion of each of the plurality of micromirrors;
    irradiating the resist with each of the plurality of second laser beams;
    developing the resist; and
    etching a part of the first interlayer insulating film and a part of the second interlayer insulating film to form a contact hole,
    wherein a spot size of each of the plurality of first laser beams on each of the plurality of micromirrors is smaller than a size of a surface area of each of the plurality of micromirrors.

6. The method for manufacturing a semiconductor device according to claim 5, wherein the diffractive optical element is a transmission type diffractive optical element or a reflection type diffractive optical element.

7. The method for manufacturing a semiconductor device according to claim 5,
   wherein each of the plurality of first laser beams has an equal energy to each other.

8. A method for manufacturing a semiconductor device, comprising:
   forming a first interlayer insulating film over a substrate,
   forming a second interlayer insulating film over the first interlayer insulating film;
   forming a resist on the second interlayer insulating film;
   dividing a laser beam into a plurality of first laser beams by a diffractive optical element;
   deflecting each of the plurality of first laser beams by each of a plurality of micromirrors to form a plurality of second laser beams, wherein each of the plurality of first laser beams is converged between a central portion and a corner portion of each of the plurality of micromirrors;
   irradiating the resist with each of the plurality of second laser beams;
   developing the resist; and
   etching a part of the first interlayer insulating film and a part of the second interlayer insulating film to form a contact hole,
   wherein a spot size of each of the plurality of first laser beams on each of the plurality of micromirrors is smaller than a size of a surface area of each of the plurality of micromirrors.

9. The method for manufacturing a semiconductor device according to claim 8,
   wherein the diffractive optical element is a transmission type diffractive optical element or a reflection type diffractive optical element.

10. The method for manufacturing a semiconductor device according to claim 8,
    wherein each of the plurality of first laser beams has an equal energy to each other.

* * * * *